US008897006B2

United States Patent
Ito et al.

(10) Patent No.: US 8,897,006 B2
(45) Date of Patent: Nov. 25, 2014

(54) COOLING TECHNIQUE FOR A STORAGE SYSTEM

(75) Inventors: Takuji Ito, Hadano (JP); Akihiro Inamura, Hadano (JP); Tsuyoshi Sasagawa, Odawara (JP)

(73) Assignee: Hitachi, Ltd., Tokyo (JP)

( * ) Notice: Subject to any disclaimer, the term of this patent is extended or adjusted under 35 U.S.C. 154(b) by 296 days.

(21) Appl. No.: 13/505,401

(22) PCT Filed: Mar. 23, 2012

(86) PCT No.: PCT/JP2012/002013
§ 371 (c)(1),
(2), (4) Date: May 1, 2012

(87) PCT Pub. No.: WO2013/140461
PCT Pub. Date: Sep. 26, 2013

(65) Prior Publication Data
US 2013/0250507 A1    Sep. 26, 2013

(51) Int. Cl.
*H05K 7/20* (2006.01)
*G06F 1/16* (2006.01)
*G06F 1/20* (2006.01)
*G06F 1/18* (2006.01)
*H05K 7/14* (2006.01)

(52) U.S. Cl.
CPC .. *G06F 1/16* (2013.01); *G06F 1/20* (2013.01); *G06F 1/183* (2013.01); *H05K 7/1445* (2013.01); *H05K 7/20727* (2013.01)
USPC .............. 361/679.48; 361/679.5; 361/679.51; 361/692; 361/818

(58) Field of Classification Search
CPC ............ H05K 7/2019; H05K 7/20145; H05K 7/20618; H05K 7/20736; H05K 9/0016
USPC ........................ 361/679.47–679.51, 692, 818
See application file for complete search history.

(56) References Cited

U.S. PATENT DOCUMENTS 6,042,348 A *   3/2000  Aakalu et al. .............. 417/423.5
6,052,281 A     4/2000  Hardt et al.
(Continued)

FOREIGN PATENT DOCUMENTS

EP          1333358         8/2003
JP       2002-006994 A      1/2002
(Continued)

OTHER PUBLICATIONS

PCT Invitation to Pay Additional Fees and Annex for application PCT/JP2012/002013 mailed Oct. 24, 2012; 8 pages.
(Continued)

*Primary Examiner* — Anatoly Vortman
*Assistant Examiner* — Jacob Crum
(74) *Attorney, Agent, or Firm* — Foley & Lardner LLP

(57) ABSTRACT

First and second units are mounted on a rear side of a housing of a storage system. Either of the first and second units includes a fan. The rear side of the housing includes an upper-tier portion defining an upper-tier opening, and a lower-tier portion defining a lower-tier opening, and the housing further includes a boundary portion that is a boundary between the upper-tier portion and the lower-tier portion, and a shutter unit. The boundary portion includes a first through hole that is a through hole connecting an upper-tier passage and a lower-tier passage. When the fan is operating, if the first unit is removed from the upper-tier portion, the shutter unit blocks the upper-tier passage, and if the second unit is removed from the lower-tier portion, the shutter unit blocks the lower-tier passage.

2 Claims, 19 Drawing Sheets

(56) References Cited

U.S. PATENT DOCUMENTS

| | | |
|---|---|---|
| 6,108,203 A | 8/2000 | Dittus et al. |
| 6,710,240 B1* | 3/2004 | Chen et al. ............... 174/17 VA |
| 6,991,533 B2* | 1/2006 | Tsai et al. ..................... 454/184 |
| 7,504,591 B2* | 3/2009 | Awaji ........................... 174/355 |
| 7,911,788 B2* | 3/2011 | Sasagawa et al. ............. 361/695 |
| 8,189,329 B2* | 5/2012 | Kurokawa et al. ....... 361/679.33 |
| 8,681,489 B2* | 3/2014 | Kurokawa et al. ....... 361/679.33 |
| 2005/0113015 A1* | 5/2005 | Crippen et al. ............... 454/184 |
| 2006/0232914 A1 | 10/2006 | Hori et al. |
| 2010/0220436 A1 | 9/2010 | Miyamoto et al. |
| 2013/0160984 A1* | 6/2013 | Cash et al. .................... 165/200 |

FOREIGN PATENT DOCUMENTS

| | | |
|---|---|---|
| JP | 2008-262496 A | 10/2008 |
| JP | 2011-066132 | 3/2011 |

OTHER PUBLICATIONS

PCT International Search report on application PCT/JP2012/002013 mailed Sep. 30, 2013; 6 pages.

PCT Written Opinion of the International Searching Authority on application PCT/JP2012/002013 mailed Sep. 30, 2013; 11 pages.

* cited by examiner

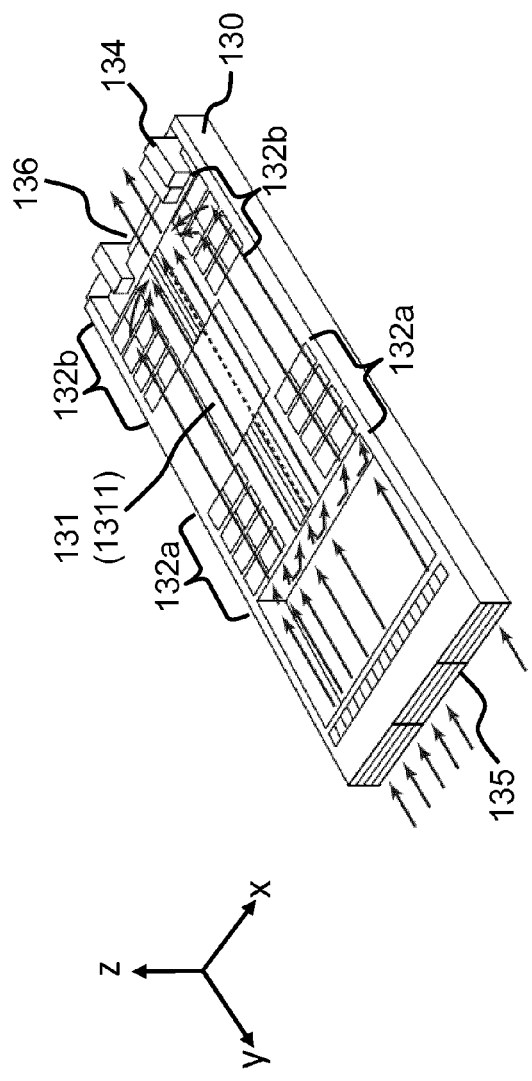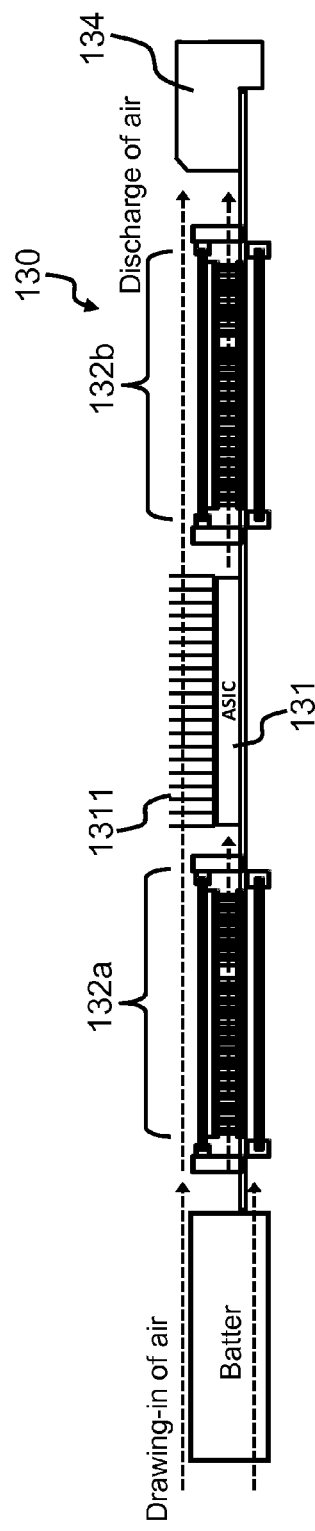

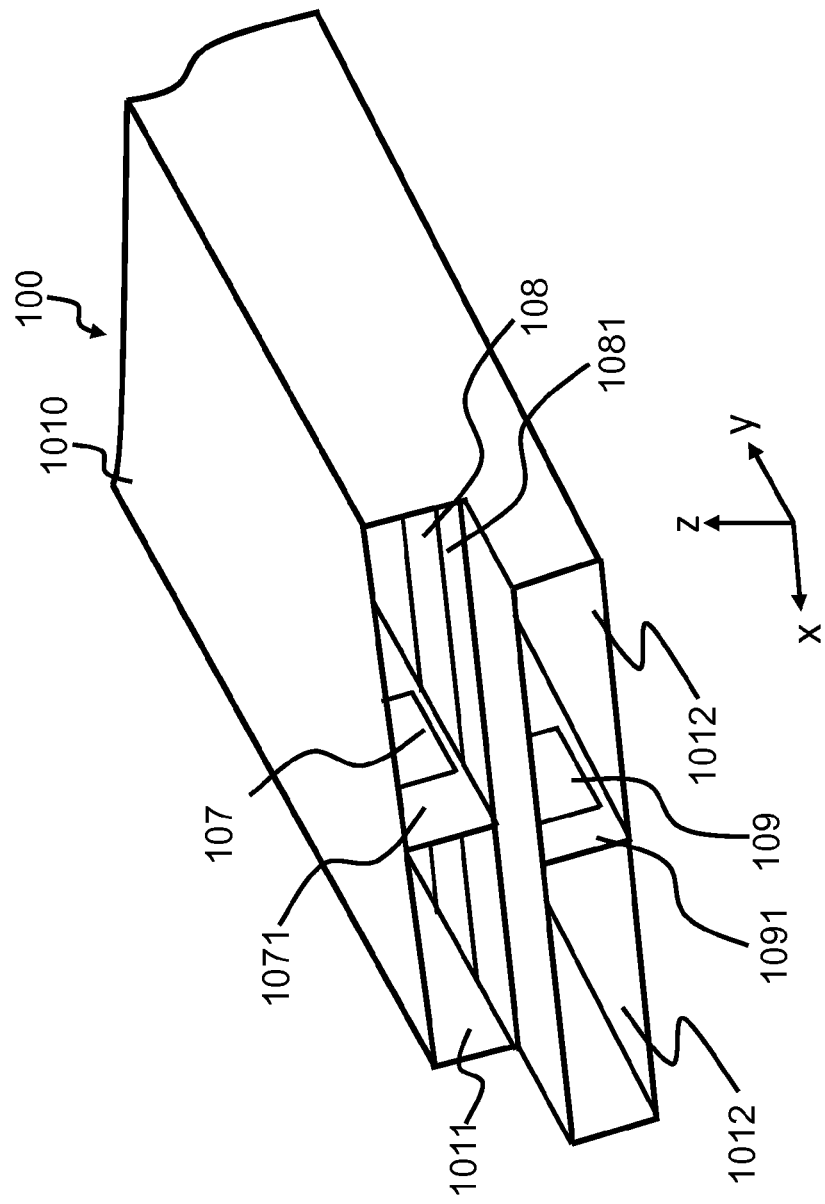
Fig. 9 --PRIOR ART--

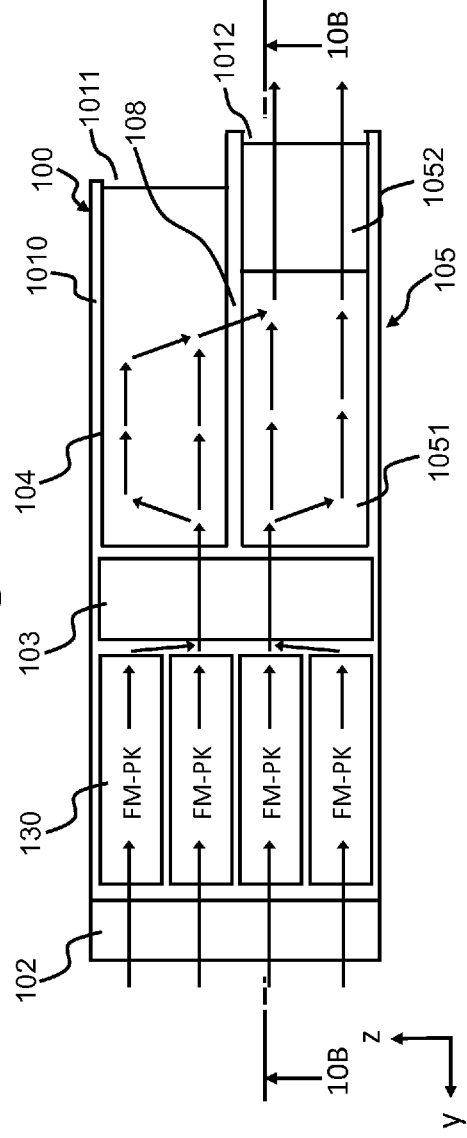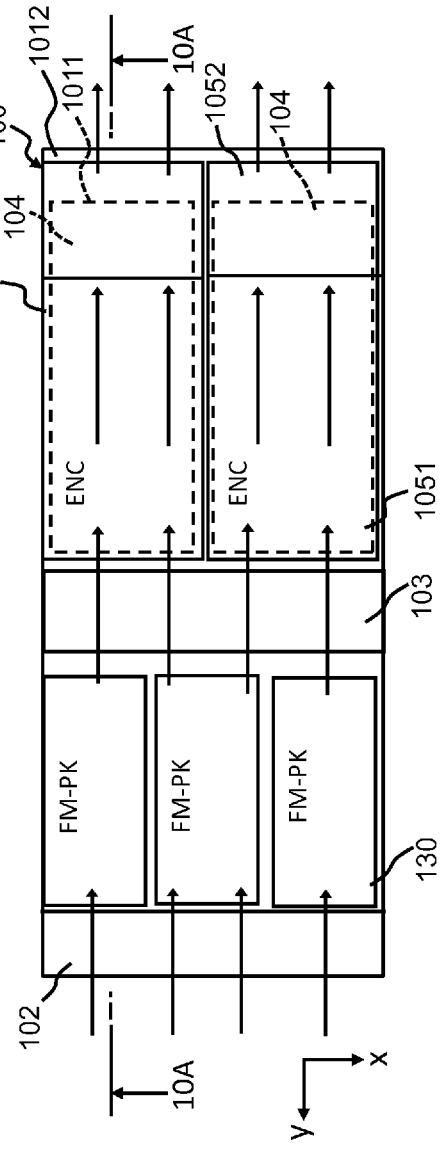

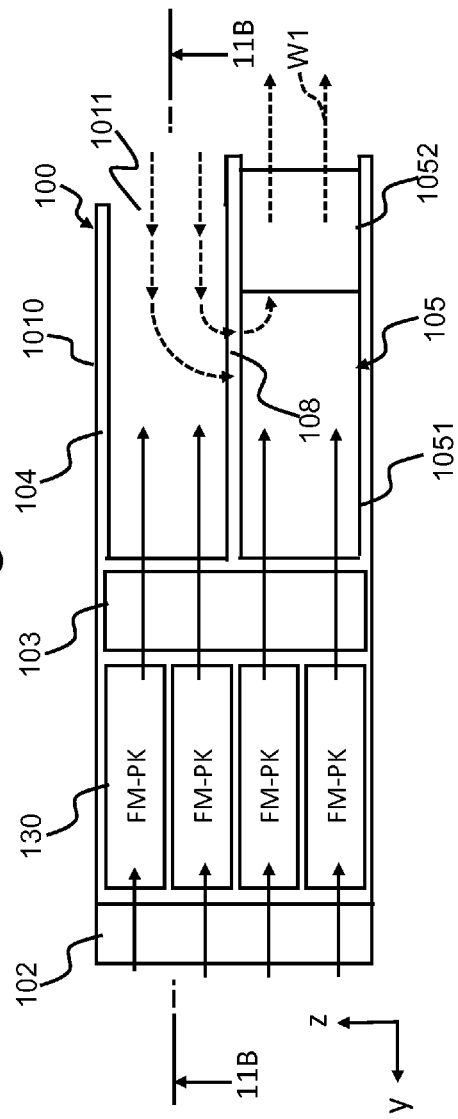
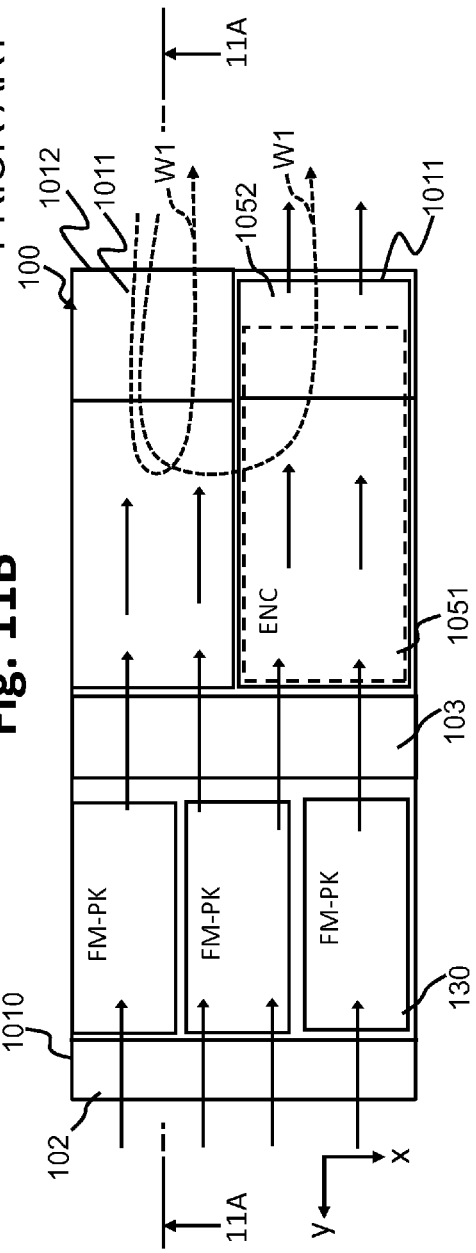

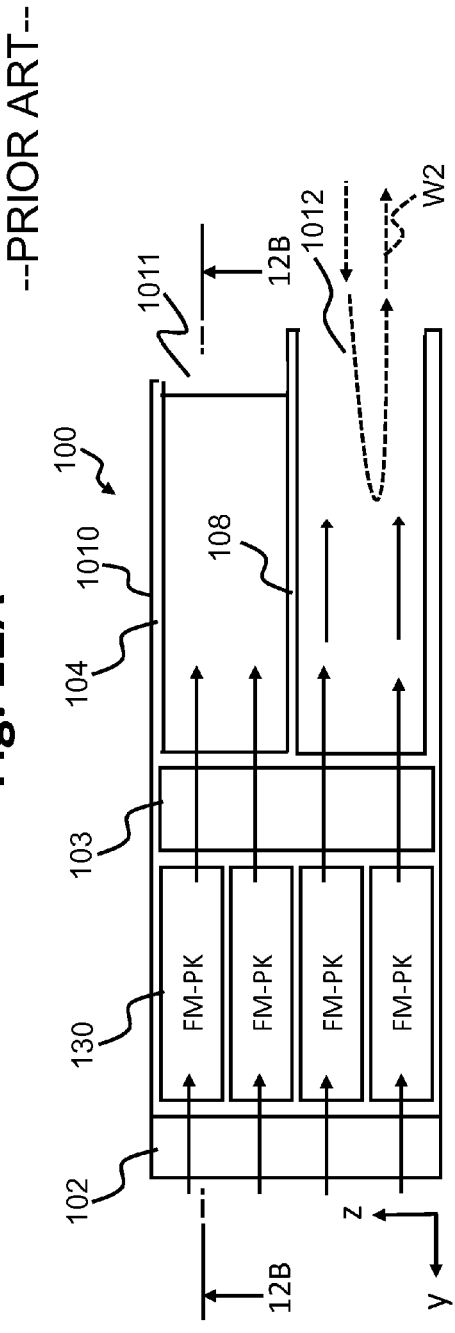
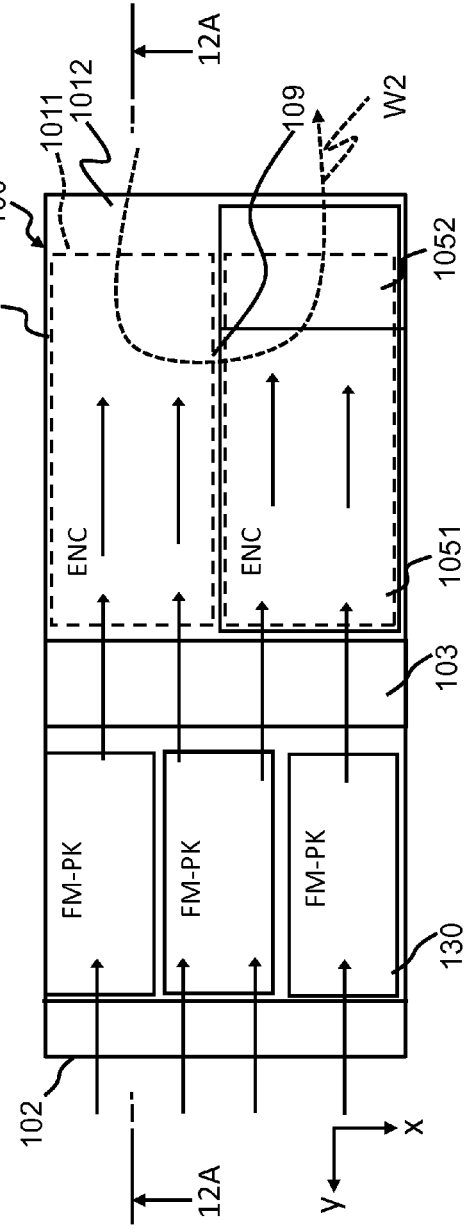

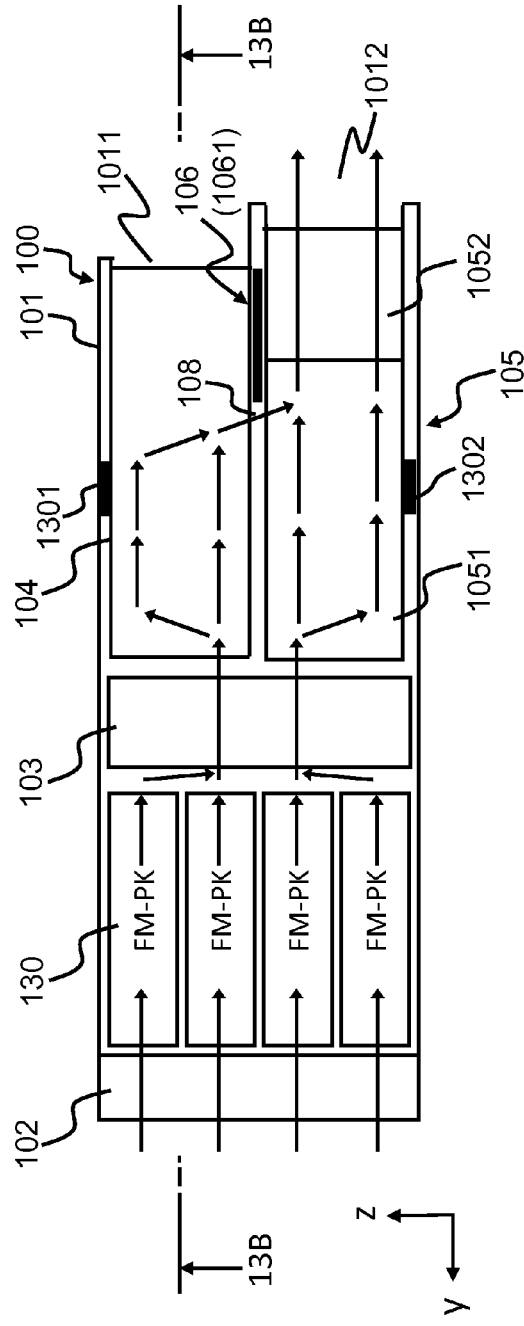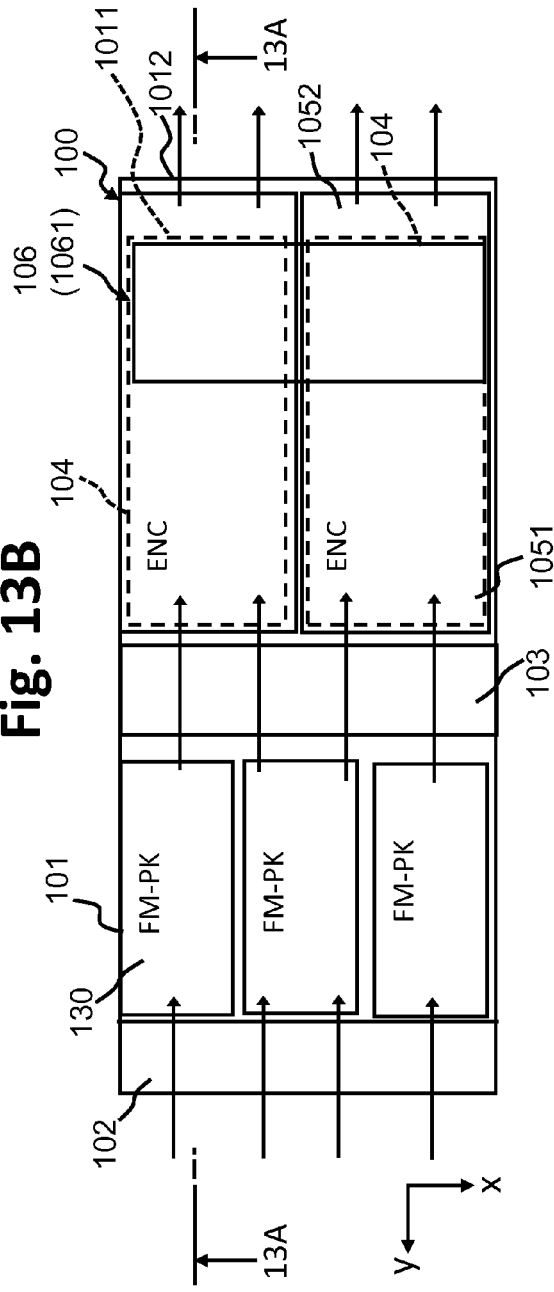

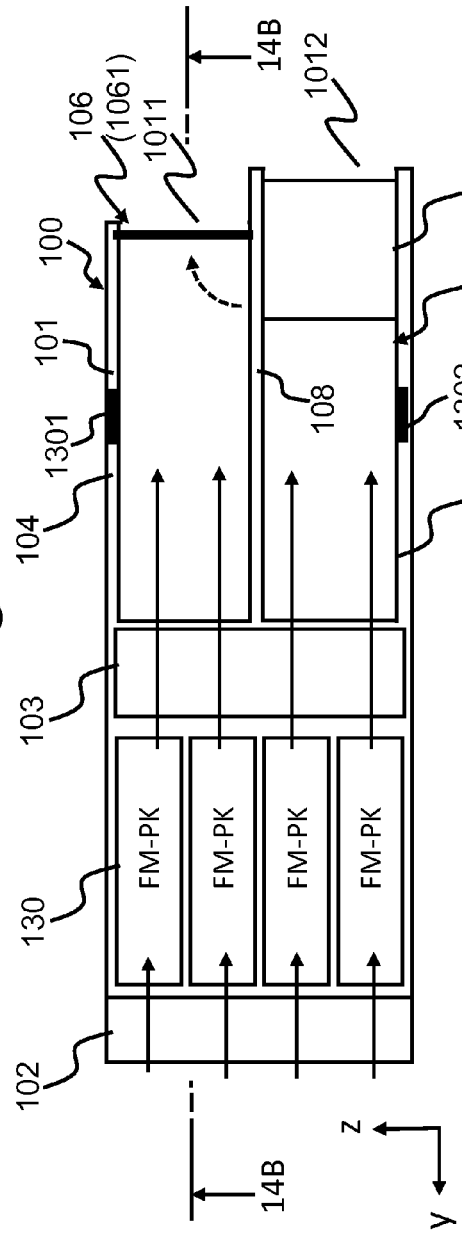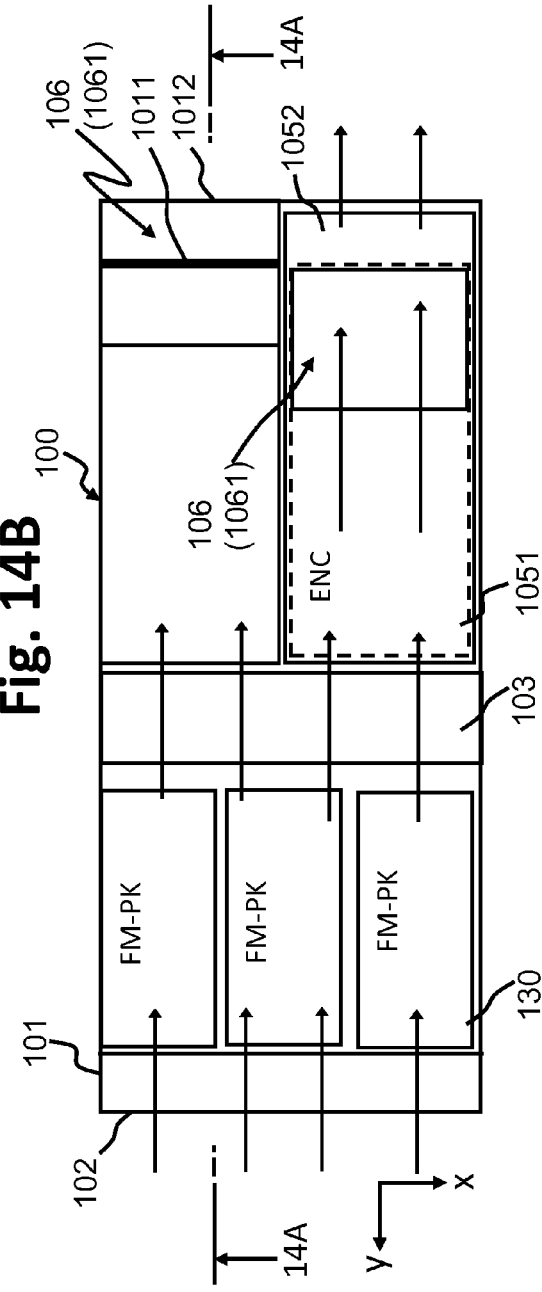

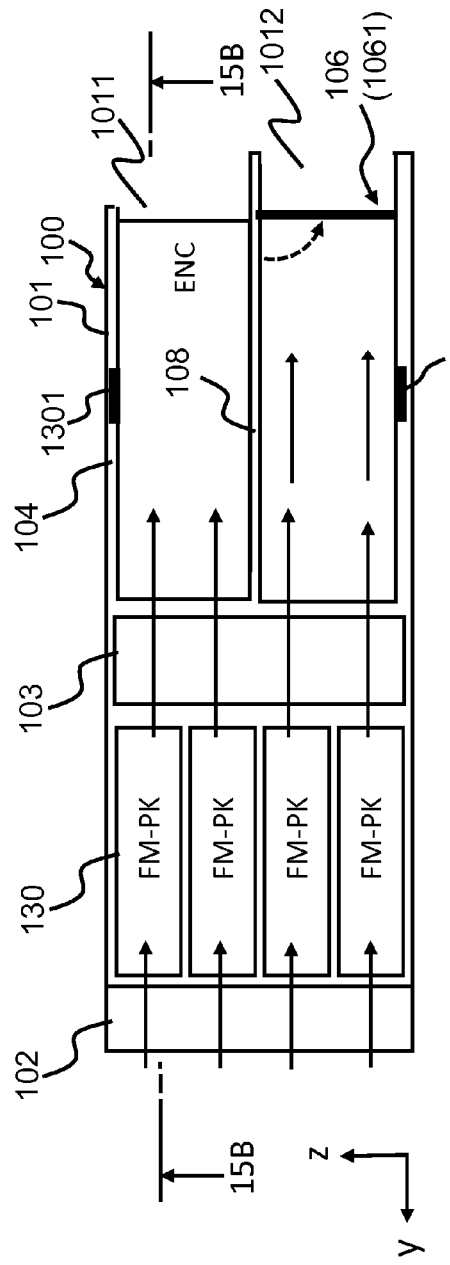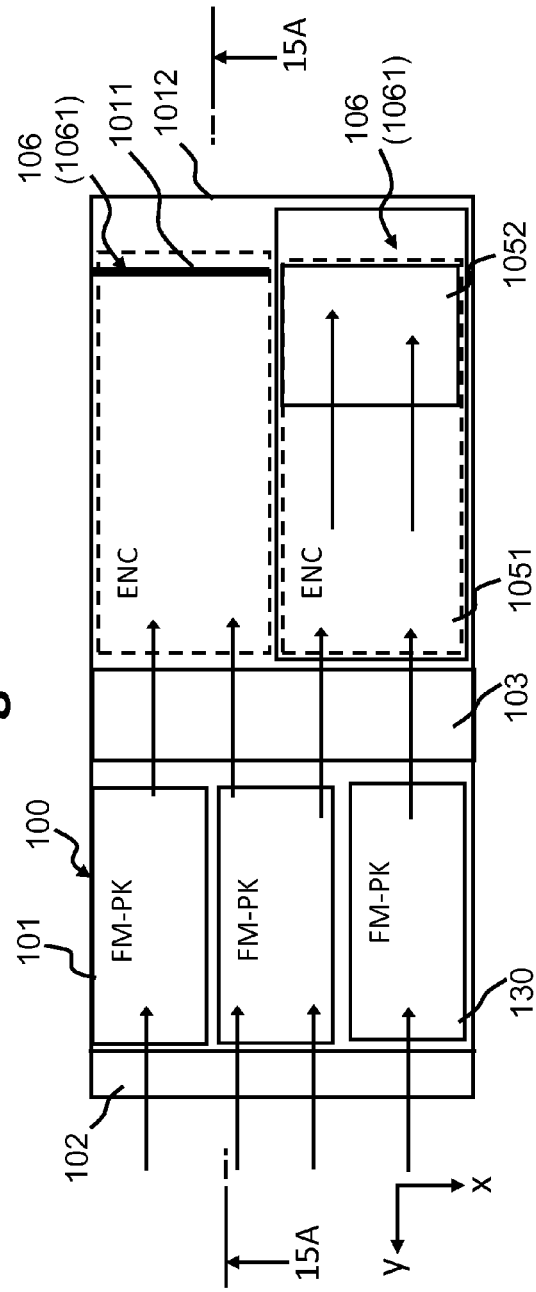

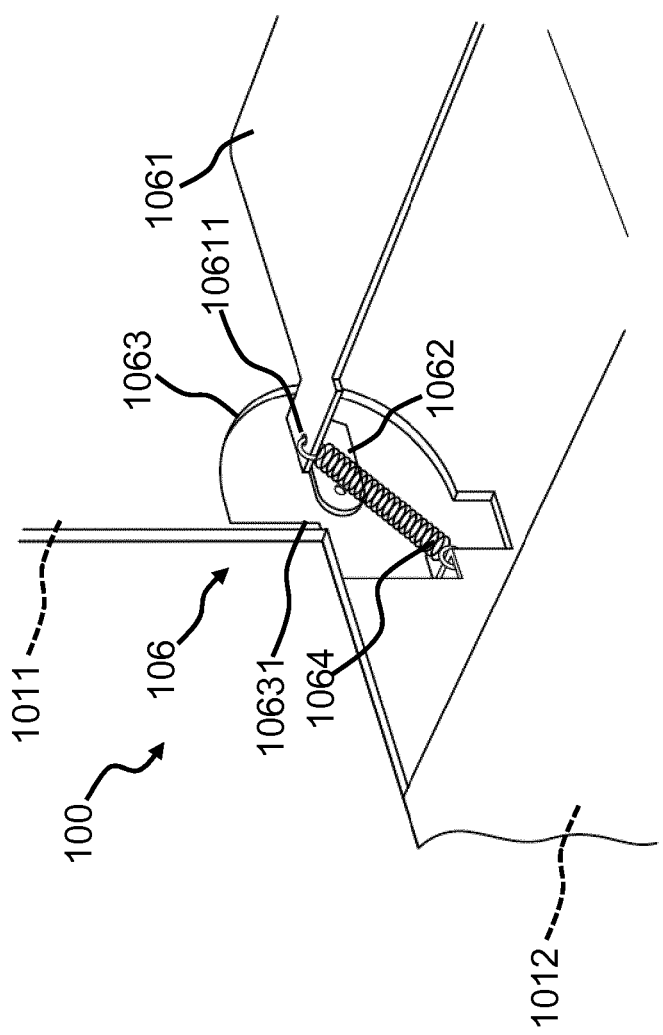

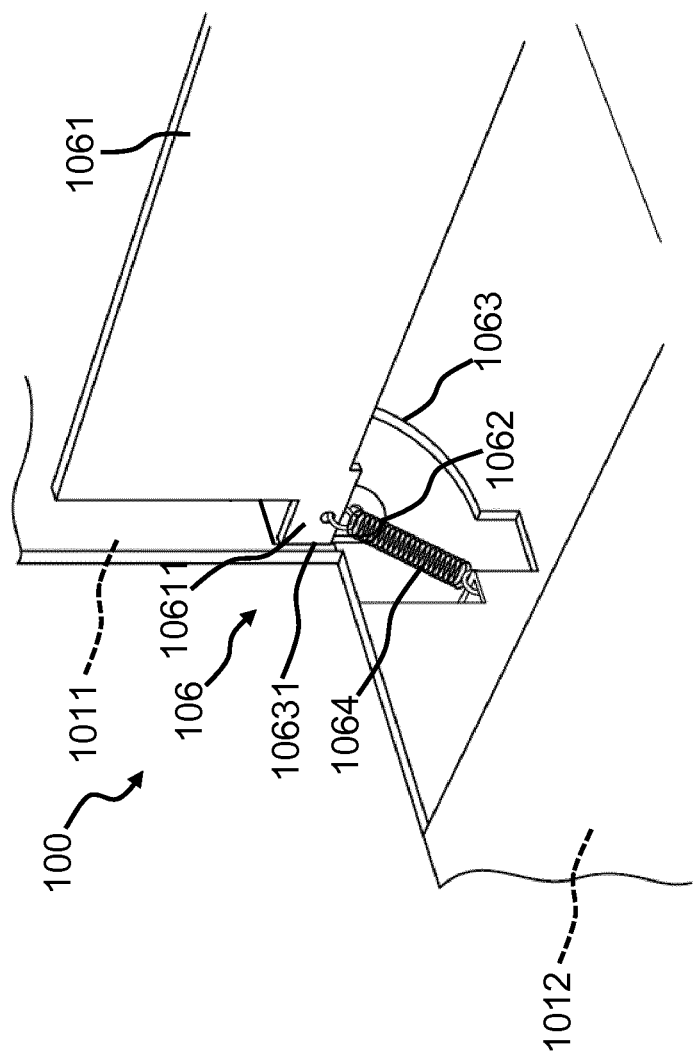

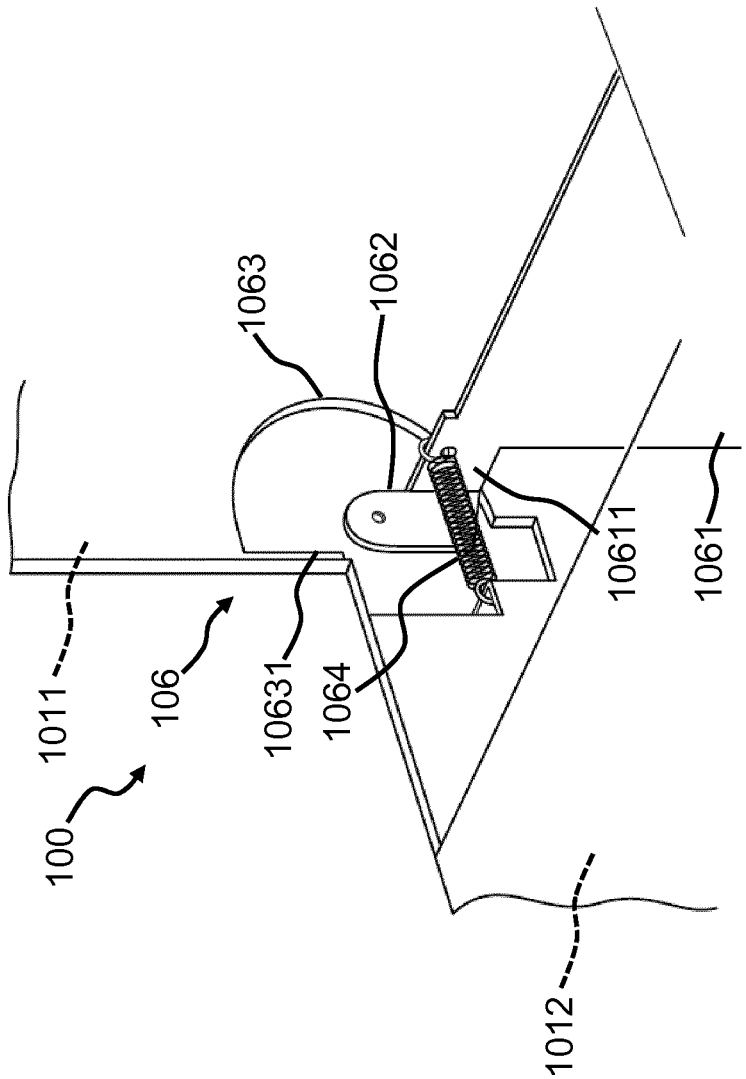

COOLING TECHNIQUE FOR A STORAGE SYSTEM

TECHNICAL FIELD

The present invention relates to a cooling technique for a storage system including a plurality of non-volatile storage mediums.

BACKGROUND ART

Storage systems each include a plurality of non-volatile storage media. For the storage systems, semiconductor storage systems are known, and in the semiconductor storage systems, for example, flash memory packages (hereinafter "FM package(s)") are employed as non-volatile storage media. Each FM package includes a plurality of flash memory chips (hereinafter "FM chips").

A plurality of FM packages are mounted in a housing of a semiconductor storage system. Furthermore, inside each FM package, a plurality of FM chips, and a control circuit for controlling the plurality of FM chips, for example, an ASIC (application-specific integrated circuit), are mounted. The ASIC needs a large amount of power to control the plurality of FM chips. When the ASIC consumes a large amount of power, an amount of heat generated from the ASIC increases. Meanwhile, the FM chips, which are main components of the semiconductor storage system, have an increased number of what is called fail bits because of the temperature increase.

One method for cooling the ASIC is to use a cooling fan (air blower). Patent Literatures 1 and 3 disclose examples of techniques for cooling a cooling target via a cooling fan.

A cooling fan is provided on the rear side of a housing, and a plurality of FM packages are provided on the front side of the housing (Patent Literature 2). When the cooling fan starts operating, air flows from the front side to the rear side of the housing. The airflow causes heat generated by the ASIC to be discharged from the rear side of the housing. In other words, the ASIC is cooled by the airflow.

CITATION LIST

Patent Literature

PTL 1: Japanese Patent Laid-Open No. 2002-006994
PTL 2: Japanese Patent Laid-Open No. 2008-262496
PTL 3: Japanese Patent Laid-Open No. 2011-066132

SUMMARY OF INVENTION

Technical Problem

In recent years, with an increase in storage capacity of semiconductor storage systems, FM packages have been densely mounted in a housing of each semiconductor storage system. Furthermore, a large number of FM chips are densely mounted in each FM package, increasing the chance of heat from an ASIC adversely affecting the FM chips.

Therefore, it is necessary to efficiently cool the heat of the ASIC to prevent the FM chips from being affected by the heat.

However, in some cases, the cooling effect may be decreased when a certain unit is removed from the housing of a semiconductor storage system with a cooling fan kept operating. More specifically, for example, there is a type of semiconductor storage system from which a unit can be removed with a cooling fan kept operating, and in which upon removal of such unit, an opening connecting a space inside the housing to a space outside the housing is formed on the side opposite to the side where an air inlet is provided. Upon removal of a predetermined unit from the housing of such type of semiconductor storage system with a cooling fan kept operating, air is drawn in from the formed opening into the housing by the cooling fan, and the flow of the drawn-in air hinders the original flow of air being drawn in from the air inlet and flowing inside the housing. Consequently, the cooling efficiency of the ASIC may be decreased.

Such problem may occur not only in semiconductor storage systems including FM packages, but also in storage systems including other types of non-volatile storage media (for example, HDDs (Hard Disc Drives)).

Solution to Problem

A storage system includes: a housing; a circuit substrate disposed inside the housing; a plurality of non-volatile storage devices inserted from a front side of the housing and coupled to the circuit substrate; and first and second units inserted from a rear side of the housing and coupled to the circuit substrate.

Either of the first and second units includes a controller that receives an I/O request from the upper-level apparatus, and performs I/O of data to/from at least one of the non-volatile storage devices according to the I/O request, and either of the first and second units includes a fan.

The rear side of the housing includes an upper-tier portion defining an upper-tier opening, the upper-tier opening being an opening that is an entrance/exit for the first unit, and a lower-tier portion defining a lower-tier opening, the lower-tier opening being an opening that is an entrance/exit for the second unit, and the housing further includes a boundary portion that is a boundary between the upper-tier portion and the lower-tier portion, and a shutter unit.

When the first unit is inserted from the upper-tier opening and coupled to the circuit substrate, an upper-tier passage that is a space leading from the upper-tier opening into an inside of the housing is blocked by the first unit, and when the second unit is inserted from the lower-tier opening and coupled to the circuit substrate, a lower-tier passage that is a space leading from the lower-tier opening into the inside of the housing is blocked by the second unit, and the boundary portion includes a first through hole that is a through hole connecting the upper-tier passage and the lower-tier passage.

When the first and second units are coupled to the circuit substrate and the fan is operating, air is drawn in from the front side of the housing, and the air passes through the circuit substrate, an inside of one of the first and second units, the first through hole and an inside of another of the first and second units and is discharged from the rear side of the housing.

When the fan is operating, if the first unit is removed from the upper-tier portion, the shutter unit blocks the upper-tier passage, and if the second unit is removed from the lower-tier portion, the shutter unit blocks the lower-tier passage.

BRIEF DESCRIPTION OF DRAWINGS

FIG. 8A is a perspective view of an FM package 130 for illustrating airflow from the front side to the rear side of the FM package 130. FIG. 8B is a diagram indicating an ASIC 131 part in the airflow in FIG. 8A in y-z coordinates.

FIG. 9 is a perspective view on the rear side of a housing 1010 where no shutter unit is present.

FIG. 10A is a schematic diagram of a side cross-section (10A-10A cross-section) for illustrating airflow inside the housing 1010 in which two ENCs 104 and two power supply units 105 are mounted. FIG. 10B is a schematic diagram of a plan cross-section (10B-10B cross-section) for illustrating airflow inside the housing 1010 in which two ENCs 104 and two power supply units 105 are mounted.

FIG. 11A is a schematic diagram of a side cross-section (11A-11A cross-section) for illustrating airflow inside the housing 1010 from which a second ENC 104 has been removed. FIG. 11B is a schematic diagram of a plan cross-section (11A-11A cross-section) for illustrating airflow inside the housing 1010 from which the second ENC 104 has been removed.

FIG. 12A is a schematic diagram of a side cross-section (12A-12A cross-section) for illustrating airflow inside the housing 1010 from which a second power supply unit 105 has been removed. FIG. 12B is a schematic diagram of a plan cross-section (12B-12B cross-section) for illustrating airflow inside the housing 1010 from which a second power supply unit 105 has been removed.

FIG. 13A is a schematic diagram of a side cross-section (13A-13A cross-section) for illustrating airflow inside a housing 101 in which two ENCs 104 and two power supply units 105 have been mounted. FIG. 13B is a schematic diagram of a plan cross-section (13B-13B cross-section) for illustrating airflow inside the housing 101 in which two ENCs 104 and two power supply units 105 have been mounted.

FIG. 14A is a schematic diagram of a side cross-section (14A-14A cross-section) for illustrating airflow inside the housing 101 from which a second ENC 104 has been removed. FIG. 14B is a plan cross-section (14B-14B cross-section) for illustrating airflow inside the housing 101 from which the second ENC 104 has been removed.

FIG. 15A is a schematic diagram of a side cross-section (15A-15A cross-section) for illustrating airflow inside the housing 101 from which a second power supply unit 105 has been removed. FIG. 15B is a schematic diagram of a plan cross-section (15B-15B cross-section) for illustrating airflow inside the housing 101 from which the second power supply unit 105 has been removed.

FIG. 16 is a perspective view of a shutter unit 106.

FIG. 17 is a perspective view of a shutter unit 106 including a shutter portion 1061, which blocks an upper-tier passage.

FIG. 18 is a perspective view of a shutter unit 106 including a shutter portion 1061, which blocks a lower-tier passage.

DESCRIPTION OF EMBODIMENTS

In the below description, processing performed by controllers (RAID controllers and ASICs) may be performed by processors included in the respective controllers executing computer programs, or may be performed by hardware circuits. The computer programs may be installed from respective program sources. The program sources may be, for example, program distribution servers or computer-readable storage media.

Also, in the below description, FM (flash memory) packages (for example, SSDs (solid state drives)), which are semiconductor storage media, are employed as non-volatile storage media; however, semiconductor storage media other than FM packages (for example, phase-change memories) may be employed. Also, magnetic storage media (for example, HDDs (hard disc drives)) can be employed as non-volatile storage media. In other words, even if non-volatile storage media included in a storage system are storage media other than FM packages, a configuration on the rear side of a semi-conductor storage system 100, which will be described below, can be employed as a configuration on the rear side of the storage system.

Figure 1:
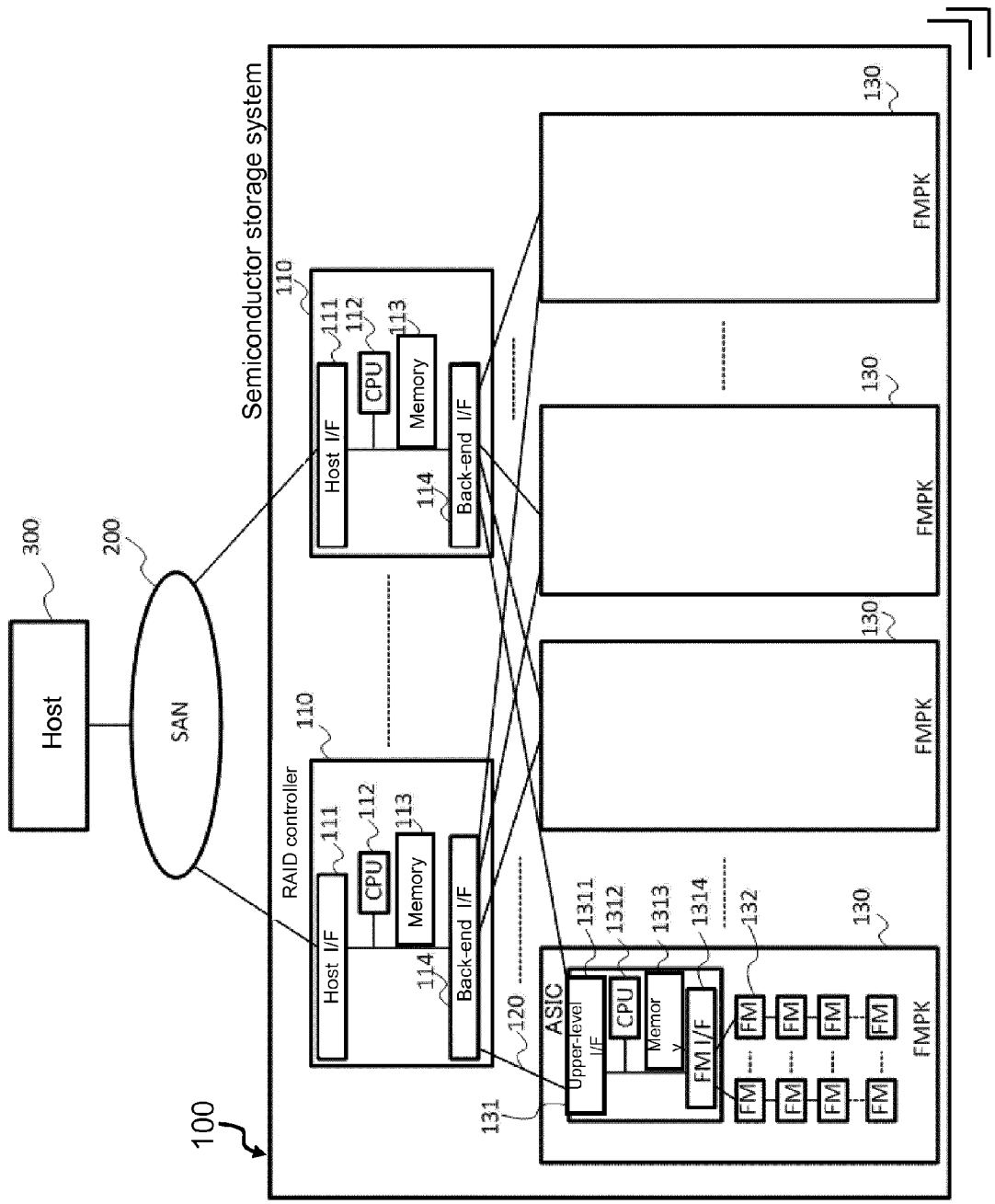
FIG. 1 illustrates an example of an overview of a computer system including a semiconductor storage system 100 according to an embodiment.

FIG. 1 illustrates an example of an overview of a computer system including a semi-conductor storage system 100 according to an embodiment.

The computer system includes a plurality of semiconductor storage systems 100 and a host computer 300. The illustrated computer system includes only one host computer 300, but may include a plurality of host computers 300. The illustrated computer system includes a plurality of semiconductor storage systems 100, but may include only one semiconductor storage system 100.

The semiconductor storage systems 100 and the host computer 300 are mutually connected via a predetermined communication network (for example, a SAN (storage area network)) 200.

The semiconductor storage systems 100 store data used in the host computer 300. The host computer 300, which performs various types of processing, reads data from the semiconductor storage systems 100 and/or writes data to the semiconductor storage systems 100.

Each semiconductor storage system 100 includes a plurality of RAID controllers 110 and a plurality of FM packages 130. The RAID controllers 110 and the FM packages 130 are coupled via internal buses 120. The RAID controllers 110 are example upper-level devices for the FMPKs 130.

Each RAID controller 110 includes communication interface devices a, a storage device, and a control device connected thereto. Examples of the communication interface devices include a host interface (host I/F) 111 and a back-end interface (back-end I/F) 114. Examples of the storage device include a memory 113. Examples of the control device include a CPU 112.

The host interface (host I/F) 111 mediates communications with the host 300. The host I/F 111 may be, for example, an FC (fibre channel). Meanwhile, the back-end I/F 114 mediates communications with the FM packages 130. The back-end I/F 114 may be, for example, a disk I/F such as that of FC, SAS or SATA.

The memory 113 stores, for example, information for controlling the FM packages 130, and programs. The CPU 112 performs various types of control processing in the RAID controller 110 by executing the programs stored in the memory 113.

Each FM package 130 includes an ASIC 131 and a plurality of flash memory chips (hereinafter FM chips) 132.

The ASIC 131 includes communication interface devices, a storage device, and a control device connected thereto. Examples of the communication interfaces include an upper-level interface (upper-level I/F) 1311, and a flash memory interface (FM I/F) 1314. Examples of the storage device include a memory 1313. Examples of the control device include a CPU 1312.

The upper-level I/F 1311 mediates communications with upper-level devices (for example, the RAID controllers 110). The FM I/F 1314 mediates communications with the FM chips 132.

The memory 1313 stores information for controlling the FM package 130, and programs. The CPU 1312 performs various types of processing in the ASIC 131 by executing the programs included in the memory 1313.

Figure 2:
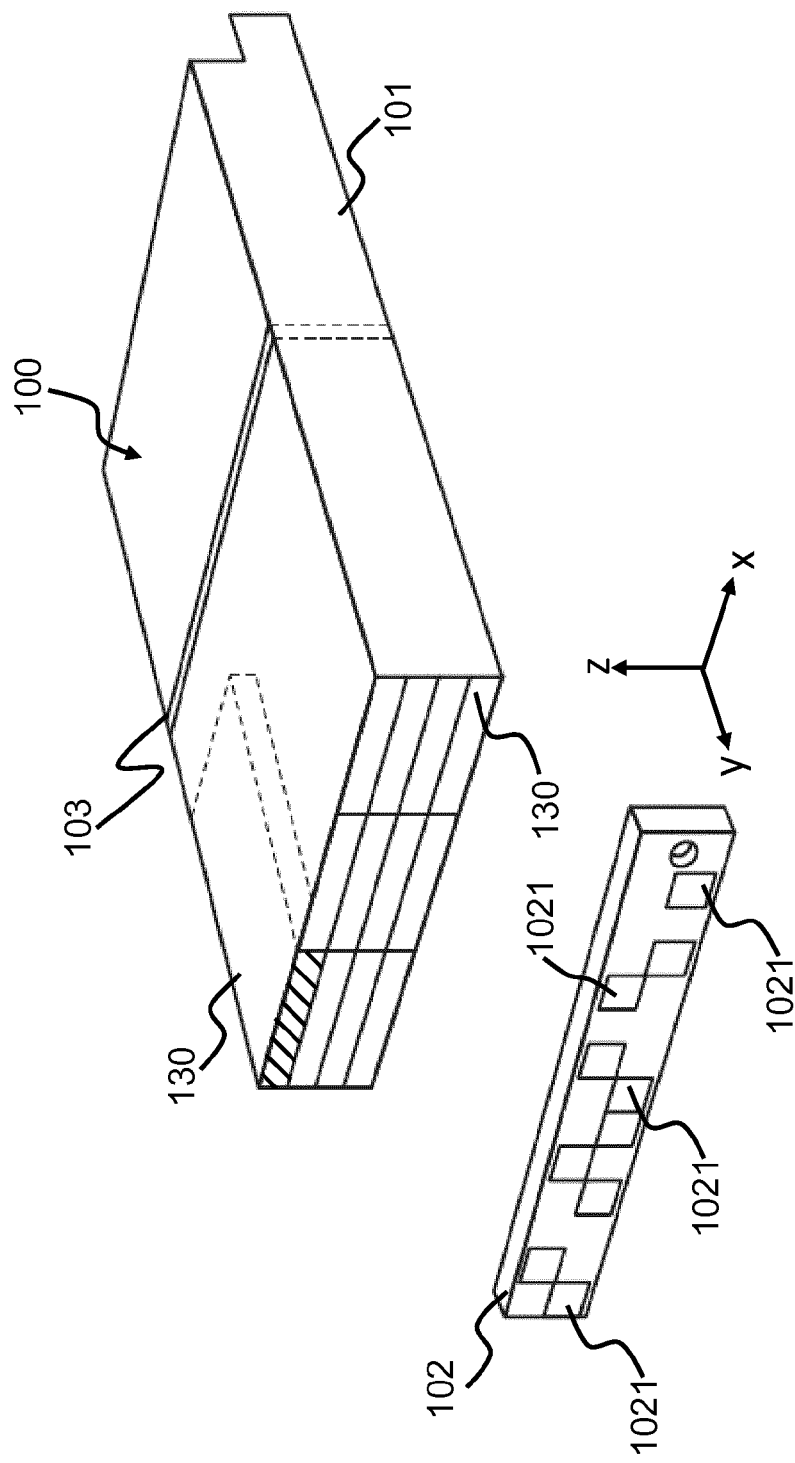
FIG. 2 is a perspective view on the front side of the semiconductor storage system 100.

FIG. 2 is a perspective view on the front side of the semiconductor storage system 100. In the below description, the front side may be referred to as a +y side, the rear side as a −y side, the right side as a +x side, the left side as a −x side, the upper side as a +z side, and the lower side as a −z side. In FIG. 2 onwards, at least one of x-, y- and z-axes are indicated and the axis directions are based on those references. The direction along the x-axis may also be referred to as width direction (or a lateral direction), and the direction along the y-axis as depth direction (or a longitudinal direction), and the direction along the z-axis as a height direction.

Each semiconductor storage system 100 includes a housing 101, a bezel 102 disposed on the front side of the housing 101, and a backboard 103 disposed at a center portion of the housing 101. In the example illustrated in the Figure, the bezel 102 and the backboard 103 are disposed in such a manner that the bezel 102 and the backboard 103 can be removed/attached from/to the housing 101. The backboard 103 may be disposed on the front side (+y side) relative to the center portion of the housing 101, or may also be disposed on the rear side (−y side) relative to the center portion of the housing 101. For example, where a length along the depth direction of the FM packages 130 is longer than a half of a length along the depth direction of the housing 101, the backboard 103 may be disposed on the rear side (−y side) relative to the center portion of the housing 101.

On the front side of the housing 101, a plurality of FM packages 130 are disposed. In the example illustrated in the Figure, twelve FM packages 130 are disposed on the front side of the housing 101. More specifically, the FM packages 130 are arranged in a matrix. For example, the FM packages 130 may be arranged in such a manner that four FM packages 130 are aligned in the height direction and three FM packages 130 are aligned in the width direction.

The bezel 102 includes a plurality of air vents 1021. The backboard 103 also includes a plurality of air vents 1031. The air vents 1021 and 1031 are all through holes extending from one surface to another surface.

From the front-surface side (+y side) of the housing 101, a predetermined number of FM packages 130 or a number of FM packages 130, the number being determined by a user, are inserted and coupled to the backboard 103 located at the center of the housing 101. Subsequently, the bezel 102 is attached to the front side, whereby the bezel 102 is disposed on the front side relative to the FM packages 130, and a front surface of the housing 101 and the FM packages 130 are covered by the bezel 102.

Figure 3:
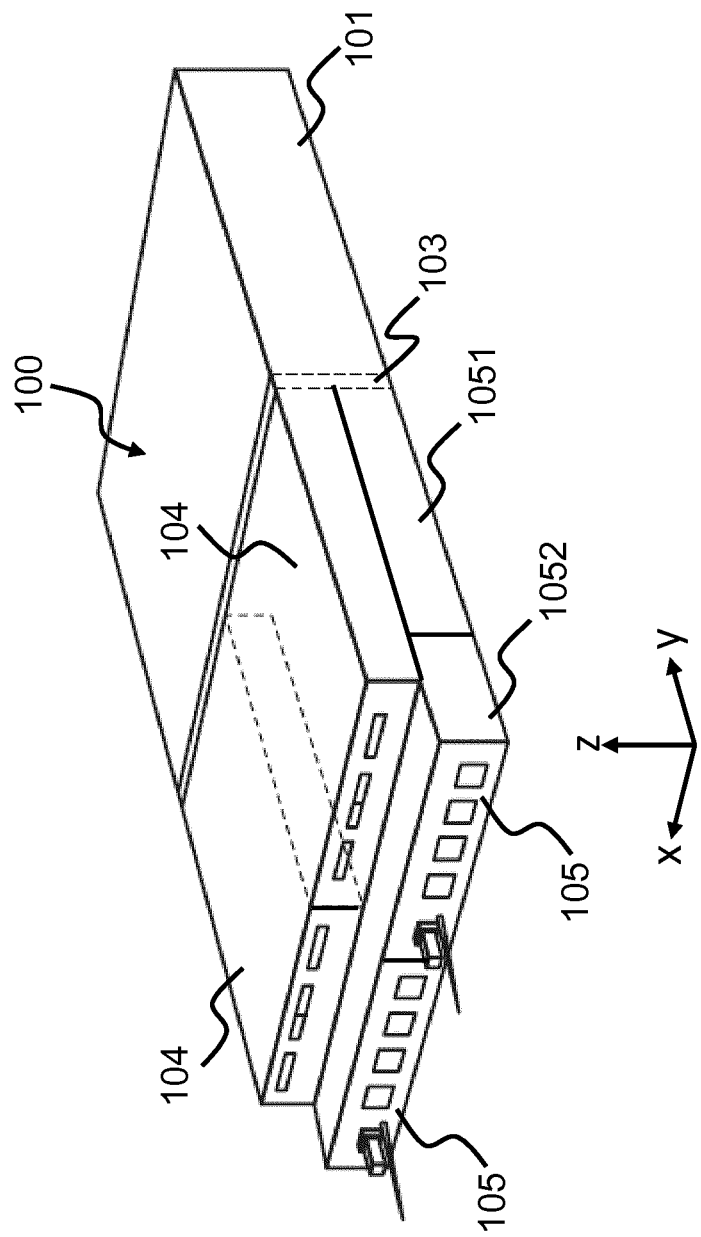
FIG. 3 is a perspective view on the rear side of the semiconductor storage system 100.

FIG. 3 is a perspective view on the rear side of the semiconductor storage system 100.

The rear side of the housing 101 illustrated in the Figure has a vertically-stacked two-tier structure. However, the structure on the rear side of the housing 101 is not limited to this one. The rear side (−y side) of the housing 101 may be divided into three or more tiers in the height direction of the housing 101.

In an upper-tier portion on the rear side of the housing 101, two enclosures (hereinafter referred to as "ENC(s)") 104 are disposed in such a manner that the ENCs 104 are aligned in the width direction of the housing 101. The two ENCs 104 are coupled to a rear surface of the backboard 103. In a lower-tier portion on the rear side of the housing 101, two power supply units 105 are disposed in such a manner that the power supply units 105 are aligned in the width direction of the housing 101. The two power supply units 105 are also coupled to the rear surface of the backboard 103. In the example illustrated in the Figure, the power supply units 105 are longer in the depth direction than the ENCs 104, and thus, the lower-tier portion is longer than the upper-tier portion on the rear side of the housing 101. However, the shape of the rear side of the housing 101 is not limited to this one. Also, the power supply units 105 may be disposed in a tier higher than that of the ENCs 104; however, where the power supply units 105 are heavier than the ENCs 104, it is preferable that the power supply units 105 be mounted in a tier lower than that of the ENCs 104 as in the present embodiment.

One ENC 104 includes one (or a plurality of) RAID controller(s) 110. The power supply units 105 each include, for example, a housing having a rectangular parallelepiped shape, and includes a power supply section 1051 and a cooling fan (hereinafter, "fan") 1052 inside the housing. The power supply section 1051 supplies power to, for example, the RAID controllers 110, the fan 1052 and the FM packages 130. The fan 1052 is disposed on the rear side (−y side) relative to the power supply section 1051.

When the fan 1052 starts operating, air is drawn in from the air vents 1021 provided in the bezel 102 toward the inside of the housing 101. The drawn-in air passes from the inside of the housing 101 through the insides of the ENCs 104 and the power supply units 105 via the air vents 1031 provided in the backboard 103 and is discharged from the rear side of the housing 101. The airflow from the front side to the rear side of the housing 101 causes heat inside the housing 101 (heat from the FM packages 130 and the power supply sections 1051) to be discharged to the outside of the housing 101 from the rear side of the housing 101.

In other words, the airflow cools the respective FM packages 130 (ASICs in particular) and the power supply sections 1051. Consequently, it is possible to reduce heat generated from the respective FM packages 130 and the power supply sections 1051, the heat remaining inside the respective FM packages 130 and inside the housing 101.

As illustrated in FIGS. 2 and 3, the front side of the housing 101 has a structure in which a plurality of non-volatile storage media (in the present embodiment, the FM packages 130) are disposed, and the rear side of the housing 101 has a structure including at least two tiers so that a plurality of units (in the present embodiment, the ENCs 104 and the power supply units 105) can be arranged in the height direction. Each of the upper-tier portion and the lower-tier portion on the rear side of the housing 101 includes an opening on the rear side thereof. Hereinafter, opening(s) in the upper-tier portion are sometimes referred to as "upper-tier opening(s)", opening(s) in the lower-tier portion as "lower-tier opening(s)" (the upper-tier openings and the lower-tier openings are illustrated in the subsequent Figures). The ENCs 104 are inserted through the upper-tier openings, and the power supply units 105 are inserted through the lower-tier openings.

Figure 4:
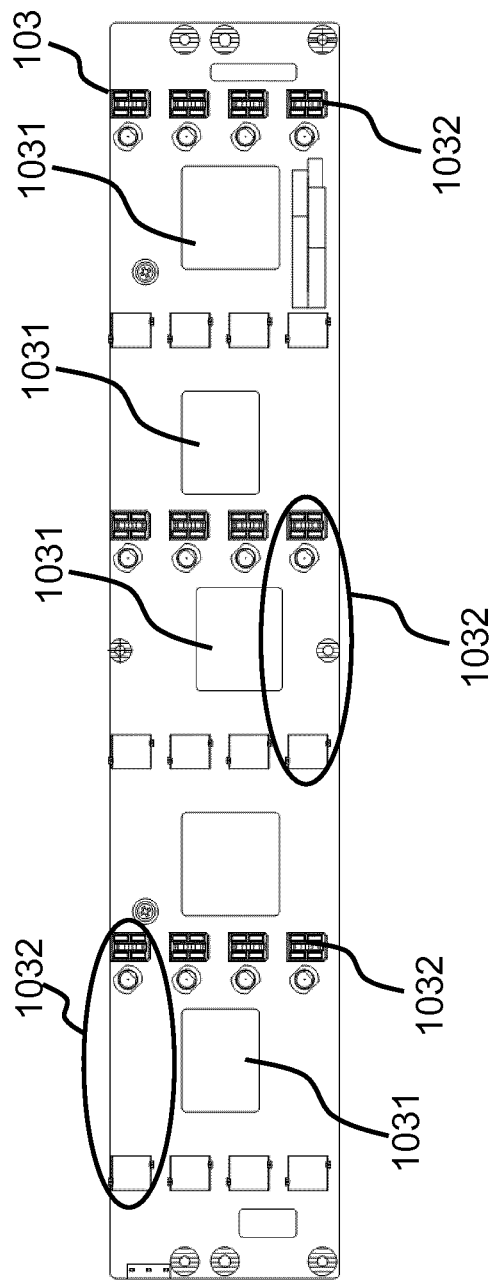
FIG. 4 illustrates details of the front side of a backboard 103.

FIG. 4 illustrates details of the front side of the backboard 103.

As described above, the backboard 103 includes the air vents 1031. For example, a number of air vents 1031 that can avoid the strength of the backboard 103 itself being lost are provided at positions where air from the front side of the housing 101 easily reaches the rear side of the housing 101.

On the front side of the backboard 103, FM package connectors 1032 for attaching the FM packages 130 to the backboard 103 are provided. Each FM package 130 is inserted into the housing 101 with the bezel 102 removed, from the front side of the housing 101. Then, each FM package 130 is coupled to the corresponding FM package connector 1032 via a connector 134 of the FM package 130. Each FM package 130 may be disposed so as to be removable/attachable from/to the housing 101.

Figure 5:
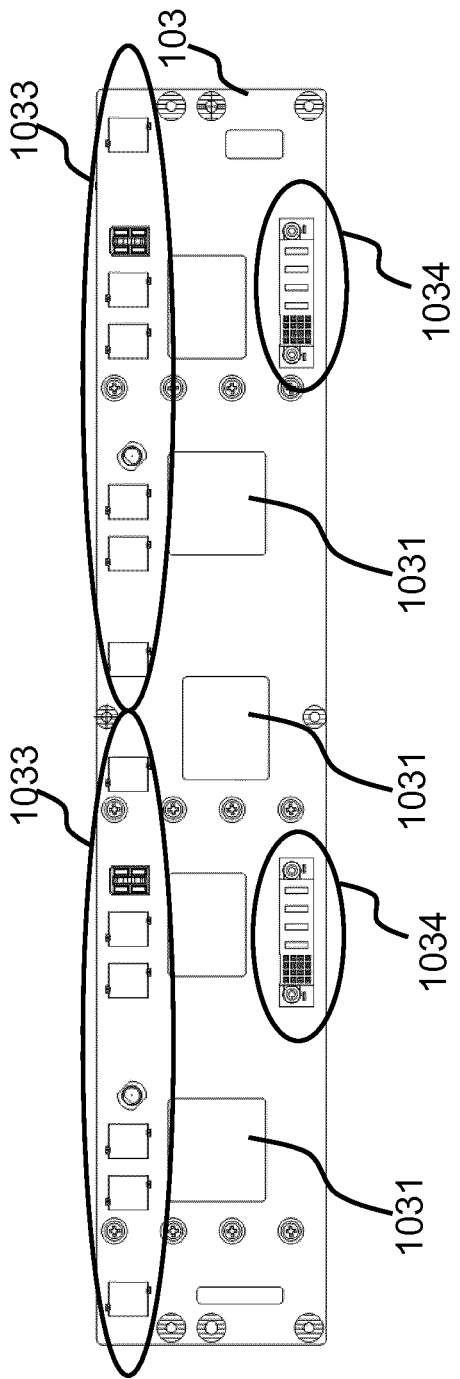
FIG. 5 illustrates details of the rear side of the backboard 103.

FIG. 5 illustrates details of the rear side of the backboard 103.

On the rear side of the backboard 103, ENC connectors 1033 for attaching the ENCs 104 to the backboard 103, and power supply connectors 1034 for attaching the power supply units 105 to the backboard 103 are provided. The ENCs 104 and the power supply units 105 are inserted into the housing 101 from the rear side of the housing 101. Then, connectors (not illustrated) included in the ENCs 104 are coupled to the ENC connectors 1033, and power supply connectors included in the power supply units 105 are coupled to the power supply connectors 1034. At least either the ENCs 104 or the power supply units 105 may be disposed so as to be removable/attachable from/to the housing 101.

The FM packages 130 and the ENCs 104 can be supplied with power from the power supply units 105 via the backboard 103. Also, each FM package 130 is communicably coupled to the ENCs 104 via the backboard 103. Consequently, for example, the RAID controllers 110 in the ENCs 104 can transmit commands to the FM packages 130 via the backboard 103, and/or receive responses to the commands from the FM packages 130 via the backboard 103.

Figure 6:
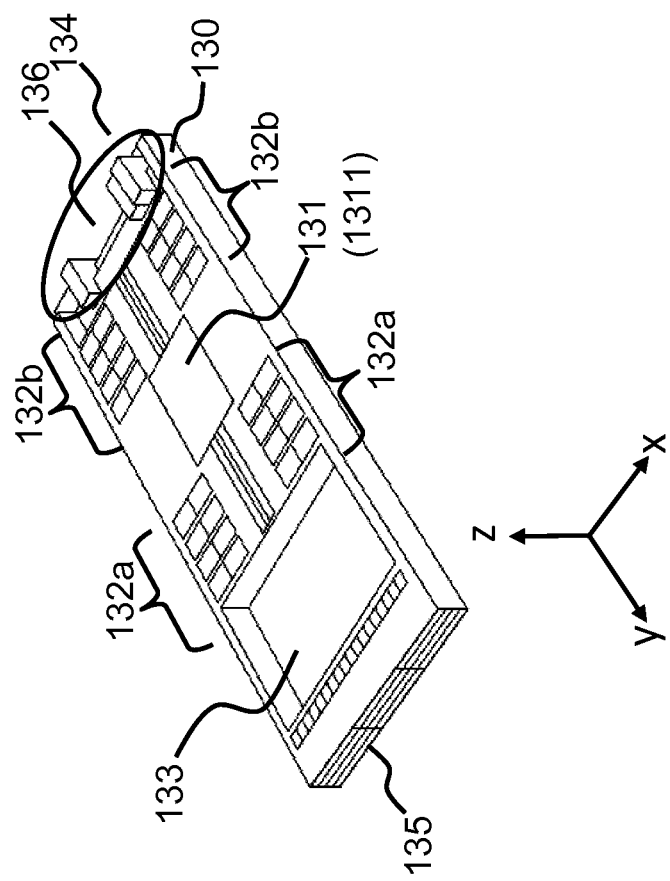
FIG. 6 is a perspective view on the face side of an FM package 130.

FIG. 6 is a perspective view on the face side of an FM package 130.

The FM package 130 includes an ASIC 131, a plurality of FM chip 132, a connector 134, an air inlet 135 and an air outlet 136. The FM package 130 further includes a battery receiving space 133 for receiving a battery therein. The battery receiving space 133 is provided on the front side (upstream side in airflow) relative to the ASIC 131 for the reasons described below.

The ASIC 131 is a controller for controlling a plurality of FM chips 132. The ASIC 131 receives a read/write request from a RAID controller, and performs read/write processing on the FM chips according to the read/write request. Also, the ASIC 131 controls reclamation and wear-leveling processing inside the FM package 130.

In the below description, with reference to the ASIC 131, a plurality of FM chips 132 disposed on the air inlet 135 side (front side) are sometimes referred to as FM chips 132a, and a plurality of FM chips 132 disposed on the air outlet 136 side (rear side) as FM chips 132b. Where both are not specifically distinguished from each other, both are simply referred to as FM chips 132. Furthermore, a heat sink 1311 is provided on the ASIC 131. A heat sink 1311 is a component which diffuses the heat emitted from the electric component generating heat in the air and lowers the temperature of the electric component. A heat sink 1311 generally is composed of a plurality of fins (a plate-shaped metal plate) arranged in parallel. According to such a configuration, the surface area of the heat sink 1311 can be large and the heat from the heating components can be easy to diffuse. A heat sink 1311 is formed in metal with high thermal conductivity, such as Al (Aluminium), as main material.

The air inlet 135 is provided on the front side of the FM package 130. Air passing through the bezel 102 (air vents 1021) passes through the air inlet 135 and flows toward the inside of the FM package 130.

The air outlet 136 is provided on the rear side of the FM package 130. Air flowing into the inside of the FM package 130 is discharged from the air outlet 136 to the outside of the FM package 130. Air passing through the FM package 130 passes through the backboard 103, and further passes through the ENCs 104 or the power supply units 105, and is discharged from the rear side of the housing 101.

The battery receiving space 133 includes a battery. The battery is normally charged with power from the power supply units 105. Where power cannot be supplied to the FM package 130 from the power supply units 105 (for example, in the case of a blackout), the battery supplies power to the ASIC 131 and the FM chips 132. Consequently, the ASIC 131 can store information in the memory 1313 in the FM chips 132 during a blackout.

Figure 7:
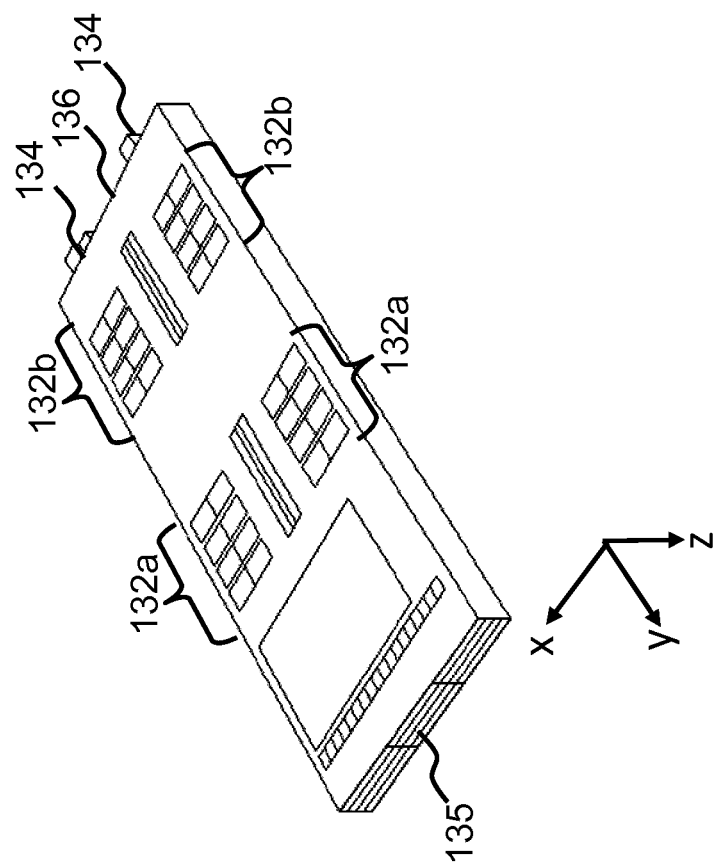
FIG. 7 is a perspective view on the underside of the FM package 130.

FIG. 7 is a perspective view on the underside of the FM package 130.

Since no ASIC 131 is disposed on the underside of the FM package 130, there is no need to actively provide an air passage for letting air from the air inlet 135 through to the air outlet 136, unlike the face side.

FM chips 132 are also disposed on the underside of the FM package 130. The positions (positions in the x-y coordinates) of the FM chips 132 on the underside may be the same as positions (positions in the x-y coordinates) of the FM chip 132 on the face side. In other words, the FM chips 132 on the underside and the FM chips 132 on the face side may be symmetrically disposed.

FIG. 8A is a perspective view of an FM package 130 for illustrating airflow from the front side to the rear side of the FM package 130. FIG. 8B is a diagram indicating an ASIC 131 part in the airflow in FIG. 8A in the y-z coordinates. As illustrated in FIGS. 8A and 8B, in the subsequent Figures, airflow may be indicated with arrows, the arrows indicating airflow are intended to roughly indicate airflow, and do not mean that air flows strictly as indicated by the arrows.

Upon the fans 1052 provided in the lower-tier portion on the rear side of the housing 101 operating, air flows into the housing 101 via the air vents 1021 of the bezel 102. The flown-in air flows into the respective FM packages 130 from the air inlets 135 of the FM packages 130. The flown-in air passes over the battery disposed on the battery receiving space 133 and through at least one of the left and the right of the battery (at least either the +x side and the −x side) and flows toward the depth direction (−y side).

The air that has passed over the battery and/or through at least one of the left and the right of the battery flows toward the rear side (−y side) along the y-axis. Accordingly, the flow includes first airflow in which air advances toward the rear side along the y-axis on the left side (−x side) (airflow cooling the FM chips 132 on the −x side), second airflow in which air advances toward the rear side along the y-axis in the center (airflow cooling the ASIC 131) and third airflow in which air advances toward the rear side along the y-axis on the right side (+x side) (airflow cooling the FM chips 132 on the +x side). The second airflow passes through the heat sink 1311 on the ASIC 131, whereby the ASIC 131 can be cooled. Cooling efficiency can be improved by making a uppermost part of the heat sink 1311 into a position higher than the top of the battery received in the battery receiving space 133. In other words, a z-coordinate of the uppermost part of the heat sink 1311 can be made larger than a z-coordinate of the uppermost part of the battery received in the battery receiving space 133. In the present embodiment, by arranging a battery on the upstream side in the FM package 130, and on the lower side (−z side), the cooling wind can mainly flow on the upper side (+z side). And it becomes possible to cool ASIC 131 more efficiently by arranging ASIC 131 and a heat sink 1311 on the upper side in the FM package 130. Furthermore, the heat sink 1311 may be formed so as to contact the top plate of the FM package 130. The cooling efficiency by a heat sink 1311 can improve further due to the heat conduction from the heat sink 1311 to the top plate of the FM package 130.

The FM chips 132 are disposed in high density so as not to be adversely affected by heat released from the ASIC 131 and so as to store a large volume of information. Furthermore, the FM chips 132 are disposed so that high performance of the ASIC 131 can be maintained. For example, the FM chips 132 are disposed as described in (a)~(c).

(a) The FM chips 132 are disposed inside the FM package 130 so that areas occupied by the FM chips 132 do not overlap (substantially do not overlap) that of the ASIC 131 in the x-axis direction. More specifically, for example, the FM chips 132 are disposed on the right and left sides of the FM package 130, and the ASIC 131 is disposed on a vacant center space on the x-axis. Inside the FM package 130, air flowing over the FM chips 132 and air flowing over the ASIC 131 substantially advance toward the rear side along the y-axis. Consequently, air with its temperature increased as a result of passing over the ASIC 131 is discharged from the FM package 130 without flowing to the FM chips 132. Accordingly, the FM chips 132 can be prevented from being adversely affected by heat from the ASIC 131. As described above, the battery is used in the case of, for example, a blackout, and thus, does not release much heat in normal time. In other words, in normal time, air passing over the battery from the air inlet 135 does not contain heat of a level that adversely affects the FM chips 132.

(b) With (a) satisfied, the FM chips 132 on the face side and the FM chips 132 on the underside are symmetrically disposed. Disposition of the FM chips 132 as described above enables the FM chips 132 to be disposed in high density in the FM package 130 while avoiding adverse effect of heat from the ASIC 131.

(c) A plurality of FM chips 132 are disposed around the ASIC 131 with the ASIC 131 as a center. Considering the performance of the FM package 130, it is favorable that a wiring between the ASIC 131 and the FM chips 132 is short. This is because if the wiring from the ASIC 131 to the FM chips 132 is long, the response performance is deteriorated. Thus, as a result of disposing the ASIC 131 at a center surrounded by a large number of FM chips 132 (disposing the FM chips 132 around the ASIC 131), it is possible to dispose a large number of FM chips 132 while shortening the wiring from the ASIC 131 to the respective FM chips 132 (so that there are no FM chips 131 with an extremely long wiring from the ASIC 131). Then, in such case, since the disposition like (a) above is employed, the FM chips 132 downstream of the ASIC 131 can be prevented from receiving the air passing over the ASIC 131.

The air discharged from the air outlet 136 is discharged from the fans 1052 to the outside of the housing 102. Thus, it is also possible to prevent air with an increased temperature from remaining inside the housing 101 and adversely affecting operation of the FM chips 132.

In the battery receiving space 133, a battery that is weak against heat may be mounted; however, in the present embodiment, as illustrated in FIG. 8A, the battery is disposed on the front side (upstream side in the airflow) relative to the ASIC 131. Consequently, it is also possible to prevent air with its temperature increased by the ASIC 131 from adversely affecting the battery.

In the present embodiment, as described above, the rear side of the housing 101 has a two-tier structure in which the ENCs 104 can be mounted in the upper tier and the power supply units 105 can be mounted in the lower tier (as described above, in the present invention, the rear side does not necessarily have two tiers, and may have three or more tiers).

In a storage system including a housing having such structure, it is desirable that, without halting the storage system, that is, with the fan 1052 in one power supply unit 105 operating, a unit other than such power supply unit 105 (either of the two ENCs 104 or the other power supply units 105) on the rear side can be removed.

However, in the case of a housing simply employing a two-tier structure on the rear side, if, with the fan 1052 in one power supply unit 105 operating, another unit is removed, the problems described below occur.

In the present embodiment, efforts have been made also to resolve such problems.

Hereinafter, for ease of description of one characteristic of the present embodiment, first, problems in a storage system including a housing simply employing a two-tier structure on the rear side will be described in details, and then such characteristic of the present embodiment will be described. In the below description, from among two elements of a same kind, an element on the +x side may be referred as "first element" and an element on the −x side as "second element". Examples of the elements here include, ENCs, power supply units, fans, upper-tier passages, upper-tier openings, lower-tier passages and lower-tier openings.

FIG. 9 is a perspective view on the rear side of a housing 1010 from which units have been removed.

On the rear side of the housing 1010, the above-described upper-tier openings 1011, which are entrances/exits for the ENCs 104, are aligned in the width direction, and the above-described lower-tier openings 1012, which are entrances/exits for the power supply units 105, are also aligned in the width direction. The lower-tier openings 1012 are located on the lower side (−z side) relative to the upper-tier openings 1011, and on the rear side (−y side) relative to the upper-tier openings 1011.

The upper-tier openings 1011 are left open where no ENCs 104 are provided, and when the ENCs 104 are mounted, the upper-tier openings 1011 are blocked by the presence of the ENCs 104. Similarly, the lower-tier openings 1012 are left open where no power supply units 105 are mounted, and when the power supply units 105 are mounted, the lower-tier openings 1012 are blocked by the presence of the power supply units 105.

Although the housing 1010 has a substantial rectangular parallelepiped shape, the lower tier is longer in the depth direction than the upper tier on the rear side. More specifically, the lower-tier openings 1012 are located on the deeper side (−y side) relative to the upper-tier openings 1011. This is because the power supply units 105 are longer than the ENCs 104 in the depth direction.

In the upper-tier portion, a partition wall 1071 extending in the depth direction and partitioning a space in the upper-tier portion into first and second upper-tier sub-spaces is provided, and the partition wall 1071 includes a through hole (hereinafter, upper-tier hole) 107 for connecting the first and second upper-tier sub-spaces. In the lower-tier portion, also, a partition wall 1091 extending in the depth direction and partitioning a space in the lower-tier portion into first and second lower-tier sub-spaces is provided, and the partition wall 1091 includes a through hole (hereinafter, lower-tier hole) 109 for connecting the first and second lower-tier sub-spaces. Furthermore, between each upper-tier sub-space and a lower-tier sub-spaces immediately therebelow, a partition wall 1081 vertically partitioning a rear-side space in the housing 1010 is provided, and the partition wall 1081 includes a through hole (hereinafter, through hole) 108. The upper-tier sub-space and the lower-tier sub-space immediately therebelow are connected via the through hole 108. The housing 101 may include holes other than the above-described holes (the upper-tier hole 107, the through hole 108 and the lower-tier hole 109). Furthermore, at least one of the upper-tier hole 107, the lower-tier hole 109 and the through hole 108 may include one or more holes. Furthermore, at least one of the upper-tier hole 107, the lower-tier hole 109 and the through hole 108 may have an arbitrary size.

FIG. 10A is a schematic diagram of a side cross-section (10A-10A cross-section) for illustrating airflow inside the housing 1010 in which two ENCs 104 and two power supply units 105 are mounted. FIG. 10B is a schematic diagram of a plan cross-section (10B-10B cross-section) for illustrating airflow inside the housing 1010 in which two ENCs 104 and two power supply units 105 are mounted. Since FIGS. 10A to 15B are diagrams for illustrating airflow inside a housing, for easy-to-see indication of arrows indicating airflow, showing of hatching in the cross-sections of, e.g., the housing 1010 is omitted.

Air drawn into the housing 1010 via the bezel 102 passes through the FM packages 130 and the backboard 103. There are two types of airflow after passing through the backboard 103. In one type of airflow, air flows inside the ENCs 104 in the upper-tier portion of the housing 1010, then flows from the ENCs 104 into the power supply units 105 in the lower-tier portion of the housing 1010 through the through holes 108, and then is discharged to the outside of the housing 1010 by the fans 1052. In the other type of airflow, air flows inside the power supply unit 105 without flowing inside the ENCs 104, and is discharged to the outside of the housing 1010 via the fans 1152. Such flows cause heat generated from the ASICs 131 inside the respective FM packages 130 to be released to the outside of the housing 1010.

As means for enabling air inside the ENCs 104 to flow into the power supply units 105 immediately therebelow, at least one of various means may be employed. For example, it is possible that: a RAID controller 110 is mounted on a ceiling of the inside of each ENC 104 and a through hole allowing air to flow into the power supply units 105 is provided in a bottom of the ENC 104; or a RAID controller 110 is mounted on the bottom of each ENC 104, and a through hole allowing air to flow into the power supply units 105 is provided in each of the bottom of the ENC 104 and the RAID controller 110. Also, it is possible that a through hole allowing air to flow into the ENCs 104 is provided in a ceiling of each power supply unit 105 housing.

FIG. 11A is a schematic diagram of a side cross-section (11A-11A cross-section) for illustrating airflow inside the housing 1010 from which a second ENC 104 has been removed. FIG. 11B is a schematic diagram of a plan cross-section (11A-11A cross-section) for illustrating airflow inside the housing 1010 from which the second ENC 104 has been removed.

Upon removal of the second ENC 104 from the housing 1010 illustrated in FIGS. 10A and 10B, a second upper-tier opening 1011 is released. When the second upper-tier opening 1011 is released, since the first fan 1052 remains operating, air is drawn into the housing 1010 from the released second upper-tier opening 1011, and the drawn-in air passes through the second power supply unit 105 in the lower-tier portion of the housing 1010 from the second through hole 108 and is discharged to the outside of the housing 1010. In other words, as a result of removal of the second ENC 104, airflow W1 from the rear side of the housing 1010 occurs in addition to airflow from the front side of the housing 1010. The airflow W1 hinders the airflow from the front side to the rear side of the housing 1010. Thus, the efficiency of cooling the ASICs 131 inside the FM packages 130 may be decreased.

FIG. 12A is a schematic diagram of a side cross-section (12A-12A cross-section) for illustrating airflow inside the housing 101 from which the second power supply unit 105 has been removed. FIG. 12B is a schematic diagram of a plan cross-section (12B-12B cross-section) for illustrating airflow inside the housing 101 from which the second power supply unit 105 has been removed.

Upon removal of the second power supply unit 105 from the housing 1010 illustrated in FIGS. 10A and 10B, the second lower-tier opening 1012 is released. When the second lower-tier opening 1012 is released, since the first fan 1052 remains operating, air is drawn into the housing 1010 from the released second lower-tier opening 1012, and the drawn-in air is discharged to the outside of the housing 1010 through the lower-tier hole 109. In other words, as a result of removal of the second power supply unit 105, airflow W2 from the rear side of the housing 1010 occurs in addition to airflow from the front side of the housing 1010. The airflow W2 hinders the airflow from the front side to the rear side of the housing 101. Thus, the efficiency of cooling the ASICs 131 inside the respective FM packages 130 may be decreased.

As described above, upon removal of either of the ENCs 104 from the upper-tier of the housing 1010, the corresponding upper-tier opening 1011 is released, and upon removal of either of the power supply units 105 from the lower tier of the housing 1010, the corresponding lower-tier opening 1012 is released. Then, the airflow W1 or W2 from the released opening (the upper-tier opening 1011 or the lower-tier opening 1012) hinders the airflow from the bezel 102, resulting in a decrease in efficiency of cooling the ASICs 131 in the FM packages 130.

Therefore, in the present embodiment, as illustrated in FIGS. 13A to 19, shutter units 106 are provided in the housing 101. Although described in detail later, the shutter units 106, upon removal of an ENC 104 from the housing 101, block the corresponding upper-tier passage, which is a space leading into the inside of the housing from the corresponding upper-tier opening 1011, at a position, for example, in the vicinity of the upper-tier opening 1011. Furthermore, the shutter units 106, upon removal of a power supply unit 105 from the housing 101, block the corresponding lower-tier passage, which is a space leading into the inside of the housing from the corresponding lower-tier opening 1012, at a position, for example, in the vicinity of the lower-tier opening 1012. Then, the shutter units 106 are configured to perform the above-described blocking, utilizing forces exerted from anti-EMI (electromagnetic interference) members (hereinafter, anti-EMI member(s)) provided for the respective ENCs 104 and power supply units 105. The anti-EMI members are elastic members, and may be, for example, gaskets or shields.

The shutter units 106 can prevent the airflow W1 or W2 from occurring inside the housing 101 even though either one of the ENCs 104 or either one of the power supply units 105 immediately below the ENCs 104 is removed from the housing 101, and thus, the hindrance to the airflow drawn in from the front side and discharged to the rear side of the housing 101 (hereinafter referred to as "original airflow" for convenience) can be reduced. Therefore, the decrease in efficiency of cooling the ASICs 131 can be reduced. Even if the shutter units 106 cannot completely block a passage to the inside of the housing from an opening 1011 or 1012, the shutter units 106 can reduce the amount of air flowing into the housing from the opening 1011 or 1012 to an amount that is small enough not to substantially impose an adverse effect on the original airflow.

Hereinafter, the shutter units 106 will be described in details with reference to FIGS. 13A to 18.

Each shutter unit 106, as illustrated in FIGS. 16 to 18, includes a shutter portion 1061, a rotatable portion 1062, a spacer 1063 and an elastic portion 1064. In the examples illustrated in FIGS. 13A to 15B, only the shutter portion 1061 in the shutter unit 106 is illustrated.

Figure 19:
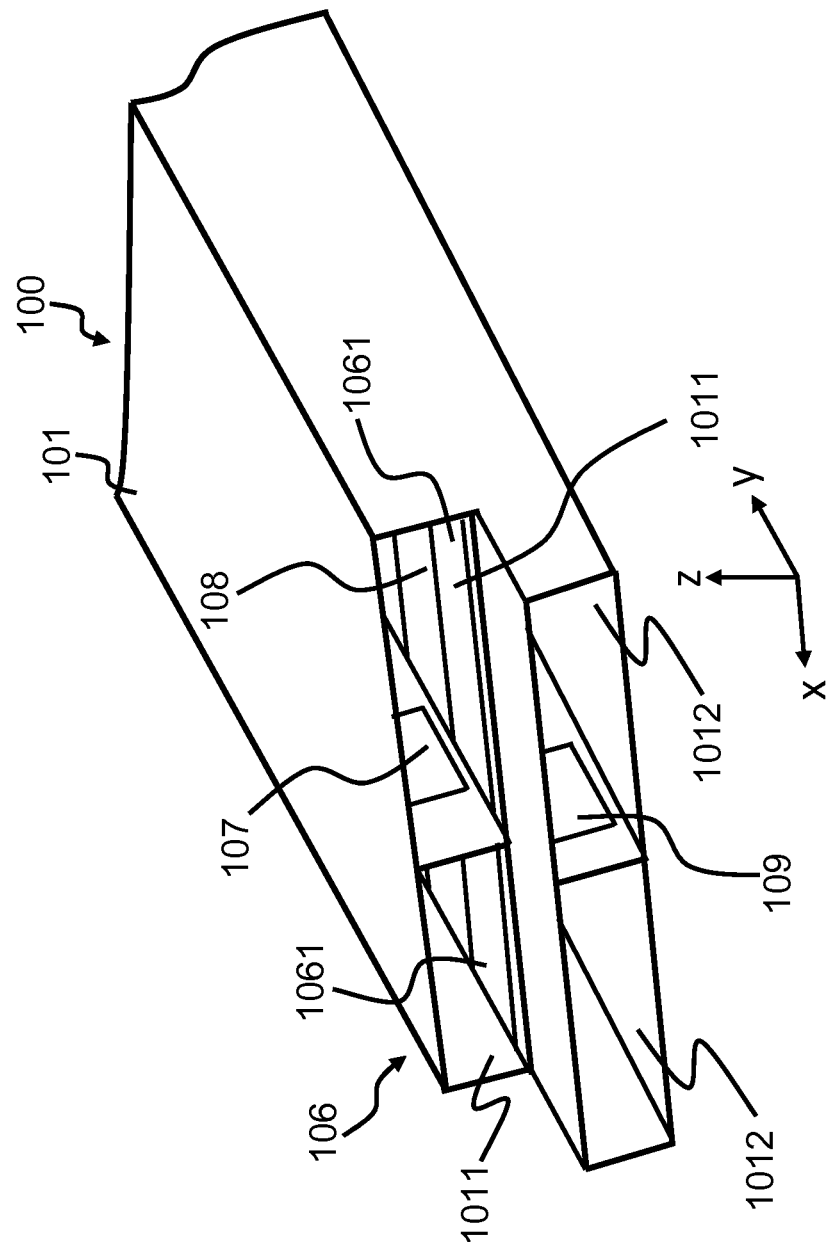
FIG. 19 is a perspective view of the rear side of a housing 101 according to an embodiment.

FIG. 19 is a perspective view of the rear side of a housing 101 according to an embodiment.

A difference between the housing 101 and the housing 1010 illustrated in FIG. 9 lies in whether or not there are the shutter units 106. The shutter units 106 include first shutter units 106 for blocking a first upper-tier passage or a first lower-tier passage, and second shutter units 106 for blocking a second upper-tier passage or a second lower-tier passage.

Each shutter portion 1061 is a member including a plane with a shape and area that are substantially equal to those of a lateral cross-section (cross-section along the x-z coordinates) of the first upper-tier passage and the first lower-tier passage or the second upper-tier passage and the second lower-tier passage. More specifically, for example, it is preferable that each shutter portion 1061 have a plate-like rectangular member and the vertical and horizontal size of the shutter portion 1061 be substantially equal to the vertical and horizontal size of a cross-section along a x-z plane of a first or second ENC 104, and also to the vertical and horizontal size of a cross-section along a x-z plane of a first or second power supply unit 105. This is because even if either one of the first or second ENC 104 and the first or second power supply unit 105 is removed from the housing 101, the passage to the inside of the housing from the corresponding upper-tier opening 1011 or the corresponding lower-tier opening 1012 (the first upper-tier passage or the first lower-tier passage, or the second upper-tier passage or the second lower-tier passage) is blocked (i.e., the passage is blocked to a degree equal to that of a state in which the first or second ENC 104, or the first or second power supply unit 105 is mounted).

One shutter portion 1061 is used for blocking for both an upper-tier passage and a lower-tier passage immediately therebelow. Accordingly, in the present embodiment, the vertical and horizontal size along the x-z plane of the ENCs 104 and the vertical and horizontal size along the x-z plane of the power supply units 105 may be substantially equal to each other. From another perspective, the shape and area of a cross-section of an upper-tier passage blocked by a shutter portion 1061 and the shape and area of a cross-section of a lower-tier passage blocked by the same shutter portion 1061 may be equal to each other.

In the present embodiment, blocking an upper-tier passage means blocking an intersection between a space leading from an upper-tier opening 1011 into a lower-tier passage immediately therebelow through a through hole 108, and a space leading from the upper-tier opening 1011 into an adjacent upper-tier passage through an upper-tier hole 107. Similarly, blocking an lower-tier passage means blocking an intersection between a space leading from a lower-tier opening 1012 into an upper-tier passage immediately thereabove through a through hole 108, and a space leading from the lower-tier opening 1012 into an adjacent lower-tier passage through a lower-tier hole 109.

Accordingly, for example, blocking an upper-tier passage may include blocking the corresponding upper-tier opening 1011 itself, and blocking a lower-tier passage may include blocking the corresponding lower-tier opening 1012 itself.

When neither the ENCs 104 nor the power supply units 105 are mounted in the housing 101, the shutter portions 1061 block either the upper-tier passages or the lower-tier passages (in FIG. 19, in order to illustrate the upper-tier openings and the lower-tier openings, the shutter portions 1061 are fitted in the through holes 108). When both the ENCs 104 and the power supply units 105 are mounted in the housing 101, the shutter portions 1061 fall between the ENCs 104 and the power supply units 105 immediately therebelow. In such state, the area of each through hole 108 is larger than that of each shutter portion 1061 so that air flowing from the front side of the housing 101 into the ENCs 104 through the backboard 103 can flow into the power supply units 105 through the through holes 108.

FIG. 13A is a schematic diagram of a side cross-section (13A-13A cross-section) for illustrating airflow inside the housing 101 in which two ENCs 104 and two power supply units 105 have been mounted. FIG. 13B is a schematic diagram of a plan cross-section (13B-13B cross-section) for illustrating airflow inside the housing 101 in which two ENCs 104 and two power supply units 105 are mounted.

As illustrated in the Figures, when both the ENCs 104 and the power supply units 105 are mounted on the rear side of the housing 101, the shutter portions 1061 fall between the ENCs 104 and the power supply units 105 immediately therebelow. More specifically, while an elastic force that causes the shutter portions 1061 to rotate in the +z direction or the −z direction is imposed on the shutter portions 1061, the direction of the force imposed on the shutter portions 1061 varies depending on whether the shutter portions 1061 are directed to the +z side or the −z side, and the shutter portions 1061 rotate in that direction. However, when both the ENCs 104 and the power supply units 105 are mounted on the rear side of the housing 101, the shutter portions 1061 are held between a force that presses the ENCs 104 downward (−z direction) by means of an elastic force from anti-EMI members 1301, and a force that presses the power supply units 105 upward (+z direction) by means of an elastic force from anti-EMI members 1302, and consequently located between the ENCs 104 and the power supply units 105 immediately therebelow.

The first and second shutter portions 1061 can operate independently from each other. For example, when the ENCs 104 and the power supply units 105 are mounted on both the right and left sides (the +x side and the −x side) of the housing 101, if the first ENC 104 and the second power supply unit 105 are removed, the first shutter portion 1061 blocks the first upper-tier passage, and the second shutter portion 1061 blocks the second lower-tier passage.

FIG. 14A is a schematic diagram of a side cross-section (14A-14A cross-section) for illustrating airflow inside the housing 101 from which the second ENC 104 has been removed. FIG. 14B is a schematic diagram of a plan cross-section (14B-14B cross-section) for illustrating airflow inside the housing 1010 from which the second ENC 104 has been removed.

Upon removal of the second ENC 104 from the housing 101, the corresponding power supply unit 105 is moved in the +z direction by a force that presses the power supply unit 105 upward (+z direction), and accompanied by that, the second shutter portion 1061 is pressed in the +z direction by the power supply units 105. An elastic force (tensile force) is imposed on the second shutter portion 1061 so that the second shutter portion 1061 rotates in the +z direction. Consequently, the second shutter portion 1061 rotates in the +z direction around a rotation shaft that is parallel to the width direction of the housing toward the second upper-tier opening 1011 until the second shutter portion 1061 reaches a position substantially perpendicular to a bottom surface of the housing 101 (parallel to an x-z plane). Consequently, the second upper-tier passage is blocked by the second shutter portion 1061 (for example, as illustrated in the Figures, the second upper-tier opening 1011 is blocked). Meanwhile, the first shutter portion 1061 remains held between the ENC 104 and the power supply unit 105 because both the first ENC 104 and the first power supply unit 105 are mounted.

FIG. 15A is a schematic diagram of a side cross-section (15A-15A cross-section) for illustrating airflow inside the housing 101 from which the second power supply unit 105 has been removed. FIG. 15B is a schematic diagram of a plan cross-section (15B-15B cross-section) for illustrating airflow inside the housing 101 from which the second power supply unit 105 has been removed.

Upon removal of the second power supply unit 105 from the housing 101, the corresponding ENC 104 is moved in the −z direction by a force that presses the ENC 104 downward (−z direction), and accompanied by that, the second shutter portion 1061 is pressed in the −z direction by the ENC 104. An elastic force (tensile force) is imposed on the second shutter portion 1061 so that the second shutter portion 1061 rotates in the −z direction. Consequently, the second shutter portion 1061 rotates in the −z direction around the rotation shaft that is parallel to the width direction of the housing toward the second lower-tier opening 1012 until the second shutter portion 1061 reaches a position perpendicular to the bottom surface of the housing 101 (parallel to an x-z plane). Consequently, the second lower-tier passage is blocked by the second shutter portion 1061. Meanwhile, the first shutter portion 1061 remains held between the first ENC 104 and the first power supply unit 105 because both the first ENC 104 and the first power supply unit 105 are mounted.

FIG. 16 is a perspective view of a shutter unit 106.

The shutter unit 106 includes a shutter portion 1061, a rotatable portion 1062, a spacer 1063 and a spring 1064. Two shutter units 106 are provided for one shutter portion 1061. FIG. 16 illustrates a shutter unit 106 on the +x side from among the two shutter units 106.

The rotatable portion 1062 is a member that rotates around a rotation shaft (not illustrated) secured to an inner side wall of the housing 101, and is attached to the shutter portion 1061. Brims 10611 extending in the +x direction (and the −x direction) are provided at opposite ends of a traverse side on the base end side (the side close to the rotation shaft) of the shutter portion 1061. The rotatable portion 1062 is coupled to the corresponding brim 10611.

The spacer 1063 forms a space that ensures rotation of the brim 10611, at the inner side wall of the housing 101 (space that prevents rotation of the brim 10611 from being hindered). In the example illustrated in the Figure, the spacer 1063 is formed by cutting the inner side wall of the housing 101 to form a semi-circular cutout. The spacer 1063 includes a stopper 10631 that stops rotation in the +z direction of the brim 10611.

The stopper 10631 is provided at a position where when a surface of the shutter portion 1061 rotating in the +z direction becomes parallel to an x-z plane, the brim 10611 of the shutter portion 1061 hits the stopper 10631. As a result of rotating in the +z direction, the brim 10611 of the shutter portion 1061 hits the stopper 10631. The stopper 10631 is located in the vicinity of the corresponding upper-tier opening 1011 that is located on the +y side relative to the lower-tier opening.

The spring 1064 is a tension coil spring that pulls the brim 10611 obliquely downward (−y and −z directions), and is an example of an elastic portion. Instead of the spring 1064, another type of elastic portion including, e.g., rubber may be employed.

An end of the spring 1064 is coupled to the brim 10611, and another end of the spring 1064 is coupled to the inner side wall of the housing 101 at a position where the spacer 1063 is formed, on the −y and −z sides relative to the rotation shaft.

When neither the corresponding ENC 104 nor the corresponding power supply unit 105 is mounted in the housing 101, the shutter portion 1061 of the shutter unit 106 blocks either the corresponding upper-tier passage or the corresponding lower-tier passage, by means of an elastic force (tensile force) from the spring 1064. When both the ENC 104 and the power supply unit 105 are mounted in the housing 101, the shutter portion 1061 of the shutter unit 106 is positioned between the ENC 104 and the power supply unit 105.

When both the ENC 104 and the power supply unit 105 are mounted, if the ENC 104 is removed, as illustrated in FIG. 17, the shutter portion 1061 is pressed in the +z direction by the anti-EMI member 1302 for the power supply unit 105, the shutter portion 1061 is rotated in the +z direction by an elastic force (tensile force) from the spring 1064, and the brim 10611 holds as a result of hitting the stopper 10631. At this time, the surface of the shutter portion 1061 is parallel to an x-z plane. Consequently, the shutter portion 1061 blocks the upper-tier passage.

When both the ENC 104 and the power supply unit 105 are mounted, if the power supply unit 105 is removed, as illustrated in FIG. 18, the shutter portion 1061 is pressed in the −z direction by the anti-EMI member 1301 for the ENC 104, the shutter portion 1061 rotates in the −z direction by means of an elastic force (tensile force) of the spring 1064, and eventually, the spring 1064 returns to have a natural length. At this time, the surface of the shutter portion 1061 is parallel to an x-z plane. Consequently, the shutter portion 1061 blocks the lower-tier passage.

Although an embodiment has been described above, the present invention is not limited to this embodiment.

For example, the shutter portion 1061 and the rotatable portion 1062 may be integrated. Where the shutter portion 1061 and the rotatable portion 1062 are integrated, easier manufacture of the shutter unit 106 can be expected.

Also, one shutter unit 106 may have two shutter portions. In this case, one shutter portion is a shutter that blocks first and second upper-tier passages (that is, a shutter portion that blocks either of the upper-tier passages), The other shutter portion is a shutter that blocks first and second lower-tier passages (that is, a shutter portion that blocks either of the lower-tier passages).

In this case, for example, when the first ENC 104 is removed from the housing 101, the shutter portion 1061 provided in the upper-tier portion rotates in the +x direction with a z-axis direction as a rotation shaft and blocks the corresponding first upper-tier passage. Also, for example, when the first power supply unit 105 is removed from the housing 101, the shutter portion 1061 provided in the lower-tier portion rotates in the +x direction with the z-axis direction as a rotation shaft and blocks the corresponding first lower-tier passage.

REFERENCE SIGNS LIST

100: semiconductor storage system, 130: FM package, 106: shutter unit, 1061: shutter portion, 1062: rotatable portion, 1063: spacer, 1064: elastic portion

The invention claimed is:

1. A storage system coupled to an upper-level apparatus, the storage system comprising:
   a housing;
   a circuit substrate disposed inside the housing;
   a plurality of non-volatile storage devices inserted from a front side of the housing and coupled to the circuit substrate; and
   first and second units inserted from a rear side of the housing and coupled to the circuit substrate,
   wherein either of the first and second units includes a controller configured to receive an I/O request from the upper-level apparatus, and to perform I/O of data to/from at least one of the non-volatile storage devices according to the I/O request;
   wherein either of the first and second units includes a fan;
   wherein the rear side of the housing includes an upper-tier portion defining an upper-tier opening, the upper-tier opening being an opening that is an entrance/exit for the first unit, and a lower-tier portion defining a lower-tier opening, the lower-tier opening being an opening that is an entrance/exit for the second unit, and the housing further includes a boundary portion that is a boundary between the upper-tier portion and the lower-tier portion, and a shutter unit;
   wherein when the first unit is inserted from the upper-tier opening and coupled to the circuit substrate, an upper-tier passage that is a space leading from the upper-tier opening into an inside of the housing is blocked by the first unit, and when the second unit is inserted from the lower-tier opening and coupled to the circuit substrate, a lower-tier passage that is a space leading from the lower-tier opening into the inside of the housing is blocked by the second unit;
   wherein the boundary portion includes a first through hole that is a through hole connecting the upper-tier passage and the lower-tier passage;
   wherein when the first and second units are coupled to the circuit substrate and the fan is operating, air is drawn in from the front side of the housing, and the air passes through the circuit substrate, an inside of one of the first and second units, the first through hole and an inside of another of the first and second units and is discharged from the rear side of the housing;
   wherein when the fan is operating, if the first unit is removed from the upper-tier portion, the shutter unit blocks the upper-tier passage, and if the second unit is removed from the lower-tier portion, the shutter unit blocks the lower-tier passage;
   wherein the shutter unit includes one shutter portion;
   wherein when the first unit and the second unit are mounted on the rear side of the housing, the shutter portion is held between the first unit and the second unit;
   wherein when the fan is operating, if the first unit is removed from the upper-tier portion, the shutter portion blocks the upper-tier passage, and if the second unit is removed from the lower-tier portion, the shutter portion blocks the lower-tier passage;
   wherein the shutter portion is rotatable around a predetermined rotation shaft, and if the first unit is removed from the upper-tier portion, the shutter portion blocks the upper-tier passage by rotating the rotation shaft in a first rotation direction, and if the second unit is removed from the lower-tier portion, the shutter portion blocks the lower-tier passage by rotating the rotation shaft in a second rotation direction that is opposite to the first rotation direction;
   wherein the shutter unit includes an elastic portion in addition to the shutter portion;
   wherein the elastic portion pulls the shutter portion toward the rear side of the housing via an elastic force;
   wherein if the first unit is removed from the upper-tier portion, the shutter portion is rotated in the first rotation direction by the elastic force, and if the second unit is removed from the lower-tier portion, the shutter portion is rotated in the second rotation direction by the elastic force;
   wherein the storage system further comprises
   a first anti-EMI (electromagnetic interference) member that is an anti-EMI member for the first unit, and
   a second anti-EMI member that is an anti-EMI member for the second unit;
   wherein each anti-EMI member includes an elastic member;
   wherein the first anti-EMI member includes a member that presses the first unit downward;
   wherein the second anti-EMI member includes a member that presses the second unit upward;
   wherein when the first unit is removed from the upper-tier portion, the second unit is moved upward by the second anti-EMI member, the shutter portion is thereby pressed upward, and the elastic force is exerted so that the shutter portion rotates in the first rotation direction, whereby the shutter portion rotates in the first rotation direction; and
   wherein when the second unit is removed from the lower-tier portion, the first unit is moved downward by the first anti-EMI member, the shutter portion is thereby pressed downward, and the elastic force is exerted so that the shutter portion rotates in the second rotation direction, whereby the shutter portion rotates in the second rotation direction.

2. The storage system according to claim 1, wherein the shutter unit includes a stopper that hits a part of the shutter portion rotated in the first rotation direction, thereby stopping the rotation in the first rotation direction of the shutter portion.

* * * * *